United States Patent
Hasebe et al.

(10) Patent No.: US 7,776,626 B2
(45) Date of Patent: Aug. 17, 2010

(54) MANUFACTURING METHOD OF SEMICONDUCTOR INTEGRATED CIRCUIT DEVICE

(75) Inventors: Akio Hasebe, Tokyo (JP); Hideyuki Matsumoto, Tokyo (JP); Shingo Yorisaki, Tokyo (JP); Yasuhiro Motoyama, Tokyo (JP); Masayoshi Okamoto, Hitachinaka (JP); Yasunori Narizuka, Yokohama (JP); Naoki Okamoto, Ome (JP)

(73) Assignee: Renesas Technology Corp., Tokyo (JP)

( * ) Notice: Subject to any disclaimer, the term of this patent is extended or adjusted under 35 U.S.C. 154(b) by 137 days.

(21) Appl. No.: 11/816,369

(22) PCT Filed: Mar. 11, 2005

(86) PCT No.: PCT/JP2005/004344

§ 371 (c)(1),
(2), (4) Date: Aug. 15, 2007

(87) PCT Pub. No.: WO2006/097982

PCT Pub. Date: Sep. 21, 2006

(65) Prior Publication Data

US 2009/0017565 A1    Jan. 15, 2009

(51) Int. Cl.
*H01L 21/66*   (2006.01)
*G01R 31/02*   (2006.01)

(52) U.S. Cl. ............................ 438/18; 257/48; 324/757

(58) Field of Classification Search .................. 438/17; 324/757, 758; 257/48
See application file for complete search history.

(56) References Cited

U.S. PATENT DOCUMENTS

| | | | | |
|---|---|---|---|---|
| 5,825,192 | A  * | 10/1998 | Hagihara | ..................... 324/757 |
| 6,586,839 | B2 * | 7/2003  | Chisholm et al. | ........... 257/773 |
| 7,049,837 | B2   | 5/2006  | Kasukabe et al. | |
| 7,219,422 | B2   | 5/2007  | Wada et al. | |
| 2002/0025417 | A1   | 2/2002  | Chisholm et al. | |
| 2002/0053917 | A1 * | 5/2002  | Tanioka et al. | .............. 324/754 |
| 2004/0070413 | A1 * | 4/2004  | Kasukabe et al. | ........... 324/754 |

FOREIGN PATENT DOCUMENTS

| | | |
|---|---|---|
| JP | 6-22885   | 2/1994 |
| JP | 07-283280 | 10/1995 |
| JP | 08-050146 | 2/1996 |
| JP | 08-201427 | 8/1996 |

(Continued)

*Primary Examiner*—Kiesha R Bryant
*Assistant Examiner*—Mark W Tornow
(74) *Attorney, Agent, or Firm*—Mattingly & Malur, P.C.

(57) ABSTRACT

A probe is contacted to a test pad, without destroying the circuit formed in the chip at the time of a probe test. Therefore, a load jig, a pressing tool, an elastomer, an adhesion ring, and a plunger are made into one by fixation with a nut and a bolt. The elastic force of the spring installed between the spring retaining jig and the load jig acts so that the member used as these one may be depressed toward pad PD. The thrust transmitted from the spring in a plunger to a thin films sheet is used only for the extension of a thin films sheet.

24 Claims, 25 Drawing Sheets

FOREIGN PATENT DOCUMENTS

| | | |
|---|---|---|
| JP | 08-220138 | 8/1996 |
| JP | 09-036188 | 2/1997 |
| JP | 09-043276 | 2/1997 |
| JP | 9-119107 | 5/1997 |
| JP | 9-189660 | 7/1997 |
| JP | 10-308423 | 11/1998 |
| JP | 11-023615 | 1/1999 |
| JP | 11-097471 | 4/1999 |
| JP | 2000-150594 | 5/2000 |
| JP | 2001-159643 | 6/2001 |
| JP | 2002-134509 | 5/2002 |
| JP | 2002-139554 | 5/2002 |
| JP | 2002-289377 | 10/2002 |
| JP | 2004-132699 | 4/2004 |
| JP | 2004-144742 | 5/2004 |
| JP | 2004-157127 | 6/2004 |
| JP | 2004-288672 | 10/2004 |
| JP | 2005-024377 | 1/2005 |
| JP | 2005-136246 | 5/2005 |
| JP | 2005-136302 | 5/2005 |
| JP | 2005-302917 | 10/2005 |

\* cited by examiner

MANUFACTURING METHOD OF SEMICONDUCTOR INTEGRATED CIRCUIT DEVICE

INCORPORATION BY REFERENCE

The present application claims priority from PCT application PCT/JP2005/004344 filed on Mar. 11, 2005, the content of which is hereby incorporated by reference into this application.

TECHNICAL FIELD

The present invention relates to the manufacturing technology of a semiconductor integrated circuit device, and particularly relates to an effective technology in the application to the electric test of a semiconductor integrated circuit conducted by pressing the probe of a probe card against the electrode pad of a semiconductor integrated circuit device.

BACKGROUND ART

The probe card which prevents a warp of a presser plate resulting from the load from a shaft and the tension of a thin film when measuring the electrical property of a semiconductor element, and obtains the good contact to a semiconductor element is disclosed by Japanese patent laid-open No. Hei 8 (1996)-220138 (Patent Reference 1).

The probe card device which can apply pressure almost uniformly to the point of contact of all the contact even when contacting contact to an electrode pad covering a wide area is disclosed by Japanese patent laid-open No. Hei 9 (1997)-43276 (Patent Reference 2).

[Patent Reference 1] Japanese patent laid-open No. Hei 8 (1996)-220138

[Patent Reference 2] Japanese patent laid-open No. Hei 9 (1997)-43276

DISCLOSURE OF THE INVENTION

A probe test exists as test technology of a semiconductor integrated circuit device. This probe test includes the functional test which confirms whether it operates as predetermined function, the test which does the test of DC operating characteristic and AC operating characteristic, and distinguishes a non defective unit/defective unit, etc.

In recent years, multi-functionalization of a semiconductor integrated circuit device advances, and making a plurality of circuits to one semiconductor chip (it only being hereafter described as a chip) is advanced. In order to reduce the manufacturing cost of a semiconductor integrated circuit device, doing microfabrication of a semiconductor element and the wiring, making small area of a semiconductor chip (it is only hereafter described as a chip), and increasing the number of acquisition chips per wafer is advanced. Therefore, the number of test pads (bonding pad) not only increases, but arranging a circuit also under a test pad is examined. Therefore, there is a possibility that a circuit may break with the impact at the time of a probe contacting a test pad.

In order to make circuit operation quick, using an insulating film with low mechanical strength and a low relative dielectric constant as an interlayer insulation film between the upper wiring and a lower layer wiring is examined. When such an insulating film with a low relative dielectric constant is used as an interlayer insulation film, the problem that the impact at the time of a probe contacting a test pad travels to a circuit further easily, and will tend to cause circuit destruction exists.

Other purpose of one typical invention disclosed by the present application is to offer the technology in which a probe is contacted to a test pad without destroying the circuit formed in the chip, at the time of a probe test.

Of the inventions disclosed in the present application, typical one will next be summarized briefly.

A manufacturing method of a semiconductor integrated circuit device concerning the present invention comprises the steps of:

(a) preparing a semiconductor wafer which is demarcated in a plurality of chip areas, in which a semiconductor integrated circuit is formed in each of the chip areas, and over which a plurality of first electrodes electrically connected with the semiconductor integrated circuit are formed over a main surface;

(b) preparing a first card including a first wiring substrate in which a first wiring is formed, a first sheet which is held at the first wiring substrate, in which a plurality of contact terminals for making the first electrodes contact and a second wiring which electrically connects with the contact terminals are formed, and with which the second wiring electrically connects with the first wiring, and a tip of the contact terminals faces a main surface of the semiconductor wafer, an adhesion ring which spaces out and holds a first region in which the contact terminals are formed in the first sheet from the first wiring substrate, an extrusion mechanism which extrudes the first region in the first sheet from a back surface side, and a pressurizing mechanism which controls an amount of contact pressurization at a time of contacting the tip of the contact terminals to the first electrodes; and (c) conducting electric test of the semiconductor integrated circuit contacting the tip of the contact terminals to the first electrodes;

wherein an extrusion amount of the first region by the extrusion mechanism and the amount of contact pressurization by the pressurizing mechanism are controlled independently, respectively.

A manufacturing method of a semiconductor integrated circuit device concerning the present invention comprises the steps of:

(a) preparing a semiconductor wafer which is demarcated in a plurality of chip areas, in which a semiconductor integrated circuit is formed in each of the chip areas, and over which a plurality of first electrodes electrically connected with the semiconductor integrated circuit are formed over a main surface;

(b) preparing a first card including a first wiring substrate in which a first wiring is formed, a first sheet which is held at the first wiring substrate, in which a plurality of contact terminals for making the first electrodes contact and a second wiring which electrically connects with the contact terminals are formed, and with which the second wiring electrically connects with the first wiring, and a tip of the contact terminals faces a main surface of the semiconductor wafer, an adhesion ring which spaces out and holds a first region in which the contact terminals are formed in the first sheet from the first wiring substrate, an extrusion mechanism which extrudes the first region in the first sheet from a back surface side, and a pressurizing mechanism which controls an amount of contact pressurization at a time of contacting the tip of the contact terminals to the first electrodes; and (c) conducting electric test of the semiconductor integrated circuit contacting the tip of the contact terminals to the first electrodes;

wherein the extrusion mechanism is stuck over the back surface side of the first region of the first sheet; and an extrusion amount of the first region by the extrusion mechanism and the amount of contact pressurization by the pressurizing mechanism are controlled independently, respectively.

When dividing into a term the outline of others which were disclosed by the present application, and explaining briefly, it is as follows.

1. A probe card, comprising:

a first wiring substrate in which a first wiring is formed;

a first sheet which is held at the first wiring substrate, in which a plurality of contact terminals for making a plurality of first electrodes formed in a main surface of a semiconductor wafer contact and a second wiring which electrically connects with the contact terminals are formed, and with which the second wiring electrically connects with the first wiring, and a tip of the contact terminals faces a main surface of the semiconductor wafer;

an adhesion ring which spaces out and holds a first region in which the contact terminals are formed in the first sheet from the first wiring substrate;

an extrusion mechanism which extrudes the first region in the first sheet from a back surface side; and a pressurizing mechanism which controls an amount of contact pressurization at a time of contacting the tip of the contact terminals to the first electrodes;

wherein an extrusion amount of the first region by the extrusion mechanism and the amount of contact pressurization by the pressurizing mechanism are controlled independently, respectively.

2. A probe card, comprising:

a first wiring substrate in which a first wiring is formed;

a first sheet which is held at the first wiring substrate, in which a plurality of contact terminals for making a plurality of first electrodes formed in a main surface of a semiconductor wafer contact and a second wiring which electrically connects with the contact terminals are formed, and with which the second wiring electrically connects with the first wiring, and a tip of the contact terminals faces a main surface of the semiconductor wafer;

an adhesion ring which spaces out and holds a first region in which the contact terminals are formed in the first sheet from the first wiring substrate;

an extrusion mechanism which extrudes the first region in the first sheet from a back surface side; and a pressurizing mechanism which controls an amount of contact pressurization at a time of contacting the tip of the contact terminals to the first electrodes;

wherein the extrusion mechanism is stuck over the back surface side of the first region of the first sheet; and an extrusion amount of the first region by the extrusion mechanism and the amount of contact pressurization by the pressurizing mechanism are controlled independently, respectively.

Advantages achieved by some of the most typical aspects of the invention disclosed in the present application will be briefly described below.

A probe can be contacted to a test pad, without destroying the circuit formed in the chip at the time of a probe test.

BEST MODE FOR CARRYING OUT THE INVENTION

Figure 1:
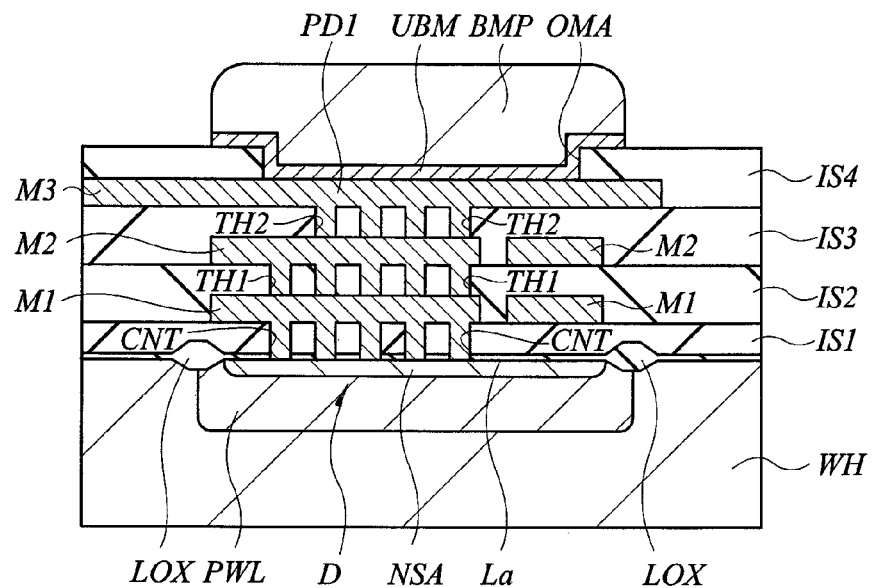
FIGS. 1 and 2 are principal part cross-sectional views of the semiconductor integrated circuit device which is Embodiment 1 of the present invention.

Prior to detailed description of the inventions according to this application, the meanings of the terms used herein will next be described.

The term "wafer" means a single crystal silicon substrate (in general, almost plane circle configuration) used for manufacture of an integrated circuit, an SOI (Silicon On Insulator) substrate, a sapphire substrate, a glass substrate, and other insulation, anti-insulation, or semiconductor substrates and those complex substrates. When calling it a semiconductor integrated circuit device in the present application, it is not made on semiconductor or insulator substrates, such as a silicon wafer and a sapphire substrate. The case where it is specified especially that that is not so shall be removed, and things made on other insulating substrates, such as glass, such as TFT (Thin Film Transistor) and an STN (Super-Twisted-Nematic) liquid crystal, shall be included.

The term "device surface" means a main surface of a wafer and the surface where the device pattern corresponding to a plurality of chip areas is formed in the surface by lithography.

The term "contact terminal" means what formed in one a wiring layer, and the point electrically connected to it by the wafer process same with using a silicon wafer for manufacture of a semiconductor integrated circuit, namely by the patterning technique which combined photolithography technology, CVD (Chemical Vapor Deposition) technology, sputtering technology, etching technology, etc.

The term "thin film probe (membrane probe)", "thin film probe card", or "projection needle wiring sheet complex" means the thin film with which the contact terminal (projection needle) in contact with a subject of examination and the wiring drawn around from there were formed, and the electrode for external contact was formed in the wiring, for example, the thing of the thickness of about 10 μm~100 μm is meant.

The term "probe card" means the structural body which has a contact terminal in contact with the wafer used as a subject of examination, a multilayer interconnection substrate, etc. The term "semiconductor test equipment" means the test equipment which has a probe card, and the sample supporting system which mounts the wafer used as a subject of examination.

The term "probe test" means an electrical test done using a prober to the wafer to which the wafer step completed, and means applying the tip of the above-mentioned contact terminal to the electrode formed on the main surface of a chip area, and conducting electric test of a semiconductor integrated circuit. The functional test which confirms whether it operates as predetermined function, and the test of DC operating characteristic and AC operating characteristic are done, and a non defective unit/defective unit is distinguished. It is distinguished from the screening test (the final test) done after dividing into respective chips (or after packaging completion).

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Further, in the below-described embodiments, it is needless to say that the constituting elements (including element steps) are not always essential unless otherwise specifically indicated or principally apparent that they are essential.

Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

And, in all the drawings for describing the embodiments, members of a like function will be identified by like reference numerals and overlapping descriptions will be omitted.

And, in this embodiment, an insulated gate field effect transistor is referred to as MISFET (Metal Insulator Semiconductor Field Effect Transistor) including MOSFET (Metal Oxide Semiconductor Field Effect Transistor).

Since it is disclosed by the patent application of the following depended on a present inventor, a related inventor, etc. about each detail of the thin film probe by the semiconductor lithography technology used by the present application, those contents are not repeated except for the time when especially required. They are the patent application, i.e., Japanese Patent Application No. Hei 6 (1994)-22885, Japanese patent laid-open No. Hei 7 (1995)-283280, Japanese patent laid-open No. Hei 8 (1996)-50146, Japanese patent laid-open No. Hei 8 (1996)-201427, Japanese Patent Application No. Hei 9 (1997)-119107, Japanese patent laid-open No. Hei 11 (1999)-23615, Japanese patent laid-open No. 2002-139554, Japanese patent laid-open No. Hei 10 (1998)-308423, Japanese Patent Application No. Hei 9 (1997)-189660, Japanese patent laid-open No. Hei 11 (1999)-97471, Japanese patent laid-open No. 2000-150594, Japanese patent laid-open No. 2001-159643, Japanese Patent Application No. 2002-289377 (corresponding U.S. patent application Ser. No. 10/676,609; U.S. filing date 2003.10.2), Japanese Patent Application No. 2002-294376, Japanese Patent Application No. 2003-189949, Japanese Patent Application No. 2003-075429 (corresponding U.S. patent application Ser. No. 10/765,917; U.S. filing date 2004.1.29), Japanese patent laid-open No. 2004-144742 (corresponding U.S. Patent Publication No. 2004/070,413), Japanese patent laid-open No. 2004-157127, Japanese Patent Application No. 2003-371515, Japanese Patent Application No. 2003-372323, and Japanese Patent Application No. 2004-115048.

Hereafter, embodiments of the invention are explained in detail based on drawings.

Embodiment 1

Figure 2:
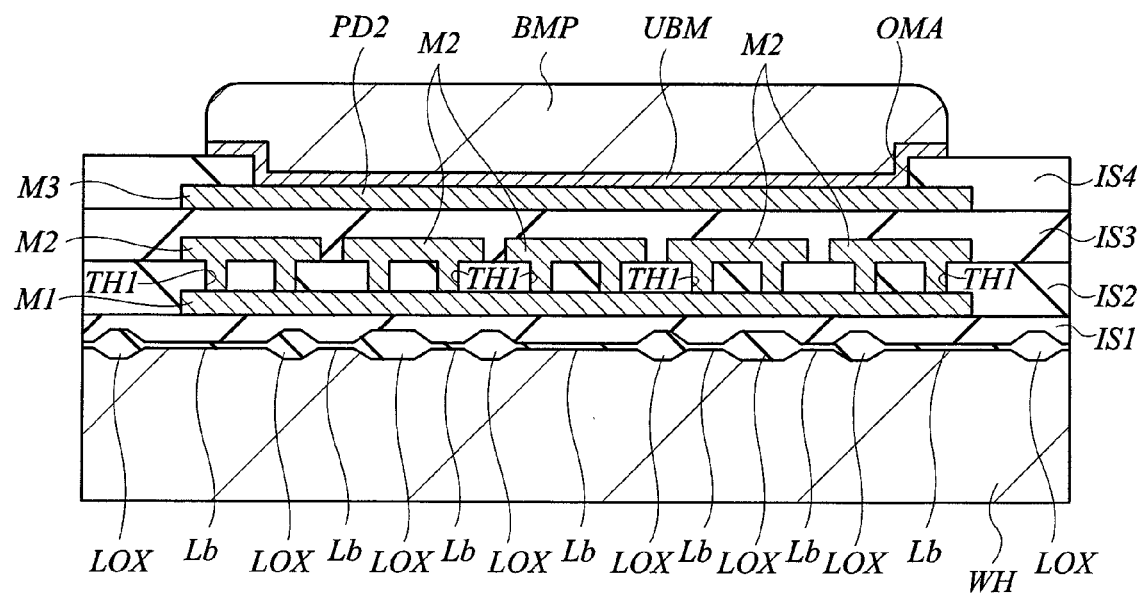

The semiconductor integrated circuit device of Embodiment 1 is the chip with which the LCD (Liquid Crystal Display) driver circuit was formed, for example. FIG. 1 and FIG. 2 are the principal part cross-sectional views of the chip, respectively, and show a section different, respectively.

Substrate WH consists of p type single-crystal Si (silicon), for example, separation part LOX is formed in the device formation surface of the main surface, and active region La and dummy active region Lb are specified to it. Separation part LOX consists of a silicon oxide film formed, for example by the LOCOS (Local Oxidization of Silicon) method. However, separation part LOX may be formed by separation part LOX of a trench type (SGI: Shallow Groove Isolation or STI: Shallow Trench Isolation).

Pn junction diode D is formed in active region La surrounded by separation part LOX of substrate WH of pad PD1 lower layer shown in FIG. 1, for example. This pn junction diode D is a protective diode for electrostatic discharge damage prevention, and is formed by the pn junction of p type well PWL of substrate WH, and n-type semiconductor region NSA of the upper part, for example. On the main surface of substrate WH, insulating film IS1 which consists of a silicon oxide film, for example is formed. Moreover, first layer wiring M1 is formed. First layer wiring M1 has the structure in which for example, titanium, titanium nitride, aluminum (or aluminum alloy), and titanium nitride deposit sequentially from a lower layer. These films, such as aluminum or an aluminum alloy, are the main wiring materials, and are formed most thickly. First layer wiring M1 is connected with n-type semiconductor region NSA D, i.e., a pn junction diode, through a plurality of contact holes CNT of the plane circular shape formed in insulating film IS1. First layer wiring M1 is covered with insulating film IS2 which consists of a silicon oxide film, for example. Second layer wiring M2 is formed on this insulating film IS2. The material structure of second layer wiring M2 is the same as the above-mentioned first layer wiring M1. Second layer wiring M2 is electrically connected with first layer wiring M1 through a plurality of through hole TH1 of the plane circular shape formed in insulating film IS2. Second layer wiring M2 is covered with insulating film IS3 which consists of a silicon oxide film, for example. Third layer wiring M3 is formed on the insulating film IS3. Third layer wiring M3 is electrically connected with second layer wiring M2 through a plurality of through hole TH2 of the plane circular shape formed in insulating film IS3. Although the most is covered with insulating film IS4 for surface protections as for third layer wiring M3, a part of third layer wiring M3 is exposed from opening OMA of the plane rectangular form formed in a part of insulating film IS4. Third layer wiring M3 portion exposed from this opening OMA is pad PD1. Insulating film IS4 for surface protections consists of the single body film of a silicon oxide film, a laminated film which has the structure which accumulated the silicon nitride film on the silicon oxide film, or a laminated film which has the structure which accumulated the silicon nitride film and the polyimide film sequentially from the lower layer on the silicon oxide film, for example. Pad PD1 is joined to bump electrode (projection electrode) BMP via ground film UBM for bump electrodes through opening OMA. Ground film UBM for bump electrodes is a film which has the barrier function to suppress or prevent that the metallic element of bump electrode BMP moves to the third layer wiring M3 side, or that the metallic element of third layer wiring M3 moves to the bump electrode BMP side on the contrary as well as the function which improves the adhesive property of bump electrode BMP, and pad PD1 and insulating film IS4. For example, it consists of a single body film of high melting point metallic films, such as titanium or titanium tungsten, or a laminated film which has the structure which accumulated a nickel film and gold sequentially from the lower layer on the titanium film. As Embodiment 1 also explained, bump electrode BMP consists of an Au film, for example, and is formed by the electroplating method.

As shown in FIG. 1, it becomes possible to arrange a wiring and an element more efficiently in a chip by setting it as the structure which arranges a wiring and an element also under bump electrode BMP. Thereby, the chip of this embodiment can be miniaturized.

On the other hand, although dummy active region Lb is formed in substrate WH of pad PD2 lower layer for dummies shown in FIG. 2 as mentioned above, the element in particular is not formed in the dummy active region Lb. Of course, a diode and other elements may be formed like other pad PD1, or a p type well, n type well, etc. may be formed. Second layer wiring M2 and first layer wiring M1 of the pad PD2 lower layer for these dummies are electrically connected through a plurality of through hole TH1. Since pad PD2 is a dummy, it does not electrically need to connect the lower layer second layer wiring M2 and first layer wiring M1. However, in order to bring further the height of the top of bump electrode BMP joined to pad PD2 for dummies close to the height of the top of bump electrode BMP joined to pad PD1, a plurality of through hole TH1 are arranged also at the lower layer of pad PD2.

Next, an example of the manufacturing process of this chip is explained. First, after forming separation part LOX, for example by the LOCOS method in the main surface of wafer form substrate WH and forming active region La and dummy active region Lb in it, an element (for example, high breakdown voltage MISFET and low breakdown voltage MISFET) is formed in active region La surrounded by separation part LOX. An element is not formed in dummy active region Lb under pad PD2 for dummies. Then, after depositing insulating film IS1 by the CVD (Chemical Vapor Deposition) method etc. on the main surface of substrate WH, contact hole CNT of plane circular shape is formed in the predetermined part of insulating film IS1 with photolithography technology and dry etching technology. Then, after depositing titanium nitride, a titanium film, an aluminum film and a titanium nitride film, for example by the sputtering method etc. sequentially from a lower layer on the insulating film IS1, first layer wiring M1 is formed by patterning the laminated metal film with photolithography technology and dry etching technology. Subsequently, insulating film IS2 is similarly deposited on insulating film IS1, and second layer wiring M2 as well as first layer wiring M1 is formed on the insulating film IS2 after forming through hole TH1 in insulating film IS2. Then, insulating film IS3 is similarly deposited on insulating film IS2, and third layer wiring M3 as well as first layer wiring M1 is formed on the insulating film IS3 after forming through hole TH2 in insulating film IS3. Then, after depositing insulating film IS4 for surface protections on insulating film IS3, opening OMA to which a part of third layer wiring M3 is exposed is formed in insulating film IS4, and pad PD1 and PD2 are formed in it. Subsequently, for example, the conductor film which consists of a single body film of high melting point metallic films, such as titanium or titanium tungsten, or a laminated film which has the structure which accumulated the nickel film and the gold film sequentially from the lower layer on the titanium film is deposited by the sputtering method etc. on insulating film IS4. Then, the photoresist pattern that a bump formation area is exposed and the part except for it is covered is formed on it.

Next, bump electrode BMP which consists of gold, for example is formed. As mentioned above, this bump electrode BMP can be formed by forming Au film with the electroplating method which used as the mask the photoresist pattern in which the opening was formed by photolithography technology.

Next, ground film UBM for bump electrodes is formed by removing the photoresist film and doing etching removal of the conductor film of the ground further. Then, substrate WH is cut to respective chips.

Figure 3:
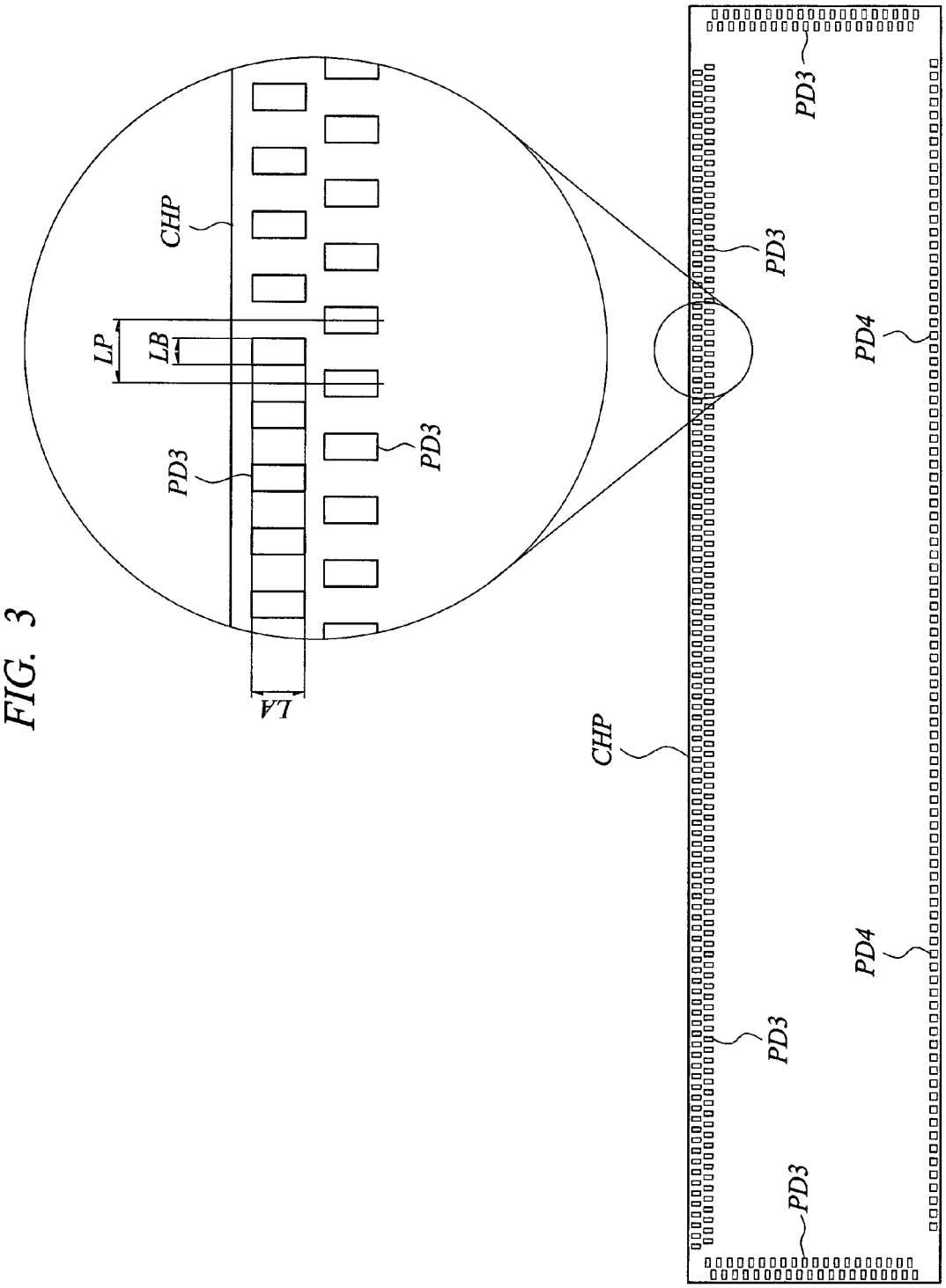
FIG. 3 is a plan view of the semiconductor chip of the object which conducts a probe test using the probe card which is Embodiment 1 of the present invention.

The probe test using the probe card of Embodiment 1 is conducted to wafer form substrate WH with which a plurality of above-mentioned chips were demarcated. FIG. 3 is illustrating the plane of the chip, and the thing which expanded the portion.

As shown in FIG. 3, many pads (first electrode) PD3 and PD4 (bump electrode BMP) which are electrically connected with an LCD driver circuit are arranged at the periphery of the main surface of chip CHP. Pad PD3 arranged along the upper long side and both the short side of chip CHP in FIG. 3 becomes an output terminal, and pad PD4 arranged along the long side of chip CHP lower part has become an input terminal. Since there are more output terminals of an LCD driver than the number of input terminals, in order to extend the gap of adjacent pad PD3 as much as possible, pad PD3 is arranged by two rows along the upper long side and both the short side of chip CHP, and pad PD3 of the mutual column is alternately arranged along the upper long side and both the short side of chip CHP. In Embodiment 1, pitch LP gas by which adjacent pad PD3 is arranged is about 68 µm, for example. In Embodiment 1, pad PD3 is a plane rectangle, length LA of the long side extending and existing in the direction which intersects (rectangularly crosses) the periphery of chip CHP is about 63 µm, and the length LB of the short side extending and existing along the periphery of chip CHP is about 34 µm. Pitch LP by which adjacent pad PD3 is arranged is about 68 µm, the length LB of the short side of pad PD3 is about 34 µm, and the gap of adjacent pad PD3 constitutes about 34 µm.

Figure 4:
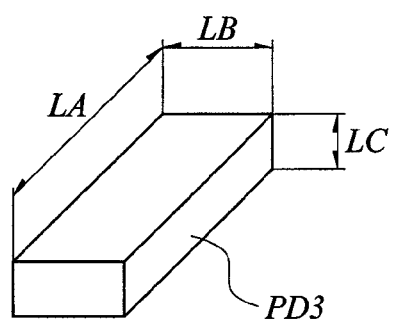
FIG. 4 is a perspective view of the pad formed in the semiconductor chip shown in FIG. 3.

As mentioned above, pad PD3 and PD4 are the bump electrodes (projection electrode) formed, for example from Au (gold). On the input output terminals (pad PD1 (refer to FIG. 1)) of chip CHP, it is formed by methods, such as electrolysis plating, electroless plating, vapor deposition, or sputtering. FIG. 4 is a perspective view of pad PD3. Height LC of pad PD3 is about 15 µm, and pad PD4 has comparable height.

In Embodiment 1, the above-mentioned probe test is carried out to a respective-chip region, before doing dicing of the wafer form substrate WH. When explaining henceforth a probe test (step at which pad PD3, PD4, and a probe contact), in not writing clearly in particular, chip CHP shall show the respective-chip region before doing dicing of the wafer.

Figure 5:
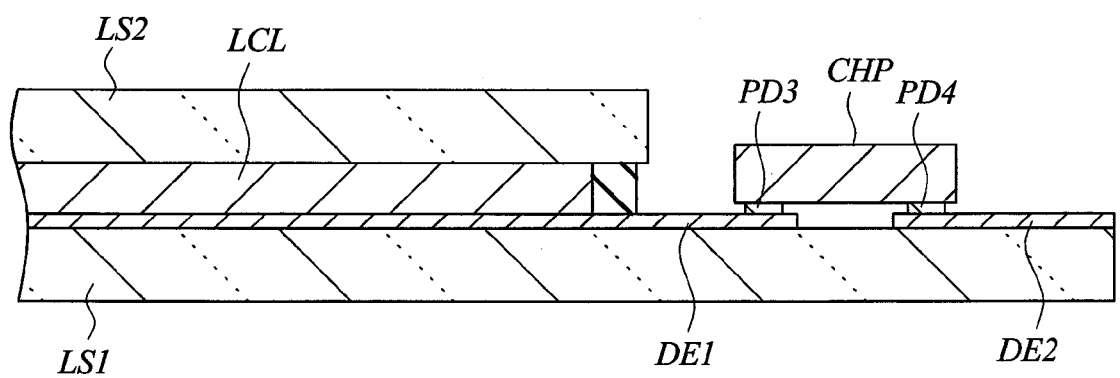
FIG. 5 is a principal part cross-sectional view showing the connection method to the liquid crystal panel of the semiconductor chip shown in FIG. 4.

FIG. 5 is a principal part cross-sectional view showing the connection method to a liquid crystal panel of the above-mentioned chip CHP. As shown in FIG. 5, the liquid crystal panel is formed, for example from glass substrate LS1 by which picture element electrode DE1 and DE2 were formed in the main surface, liquid crystal layer LCL, glass substrate LS2 arranged so that it may face with glass substrate LS1 via liquid crystal layer LCL, etc. In Embodiment 1, by doing face down bonding of the chip CHP so that pad PD3 and PD4 are connected to picture element electrode DE1 and DE2 of glass substrate LS1 of a liquid crystal panel like this, respectively, it can exemplify connecting chip CHP to a liquid crystal panel.

Figure 6:
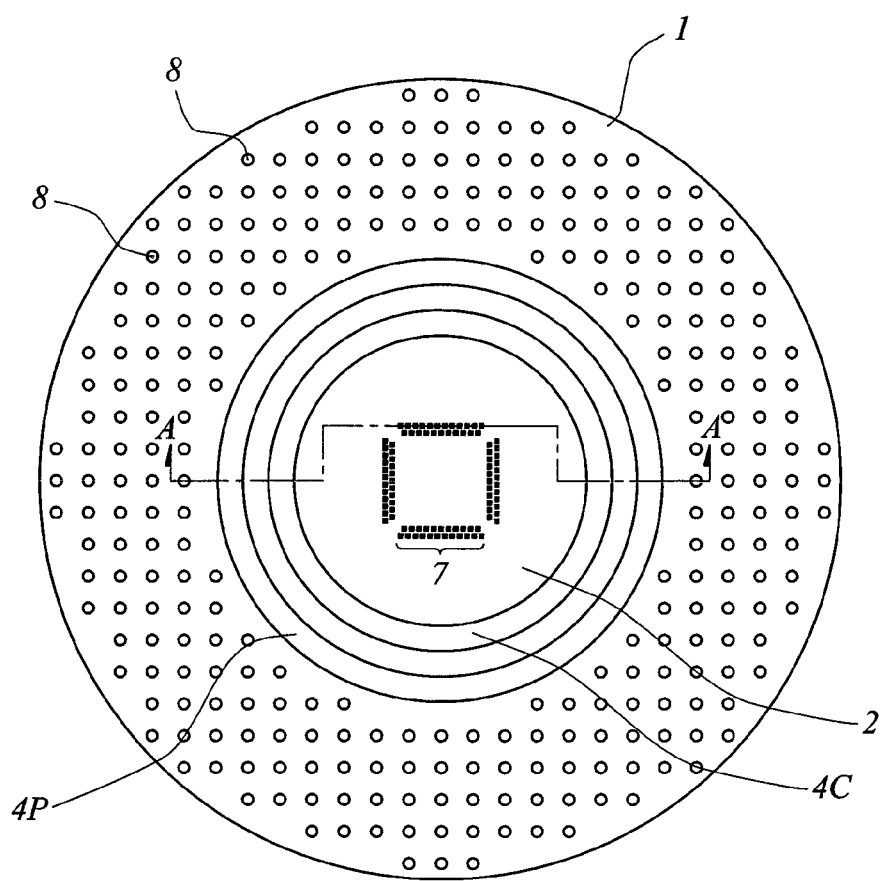
FIG. 6 is a principal part plan view of the under surface of the probe card which is Embodiment 1 of the present invention.
Figure 7:
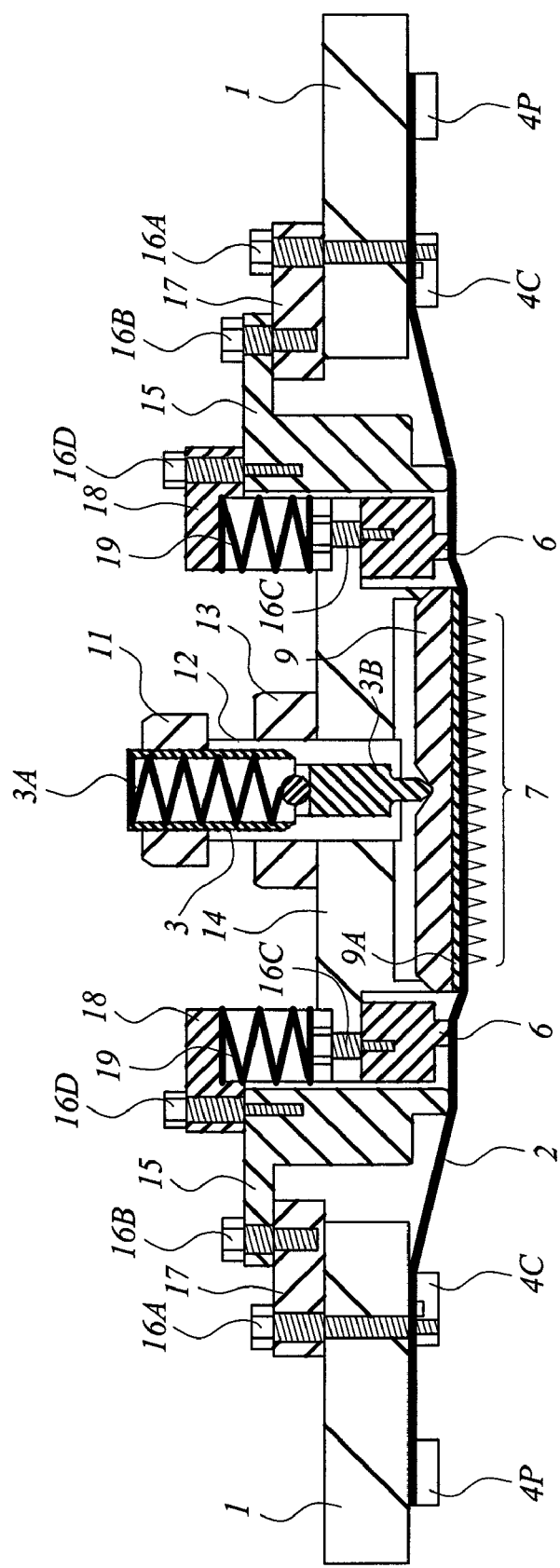
FIG. 7 is a cross-sectional view which went along the A-A line in FIG. 6.

FIG. 6 is a principal part plan view of the under surface of the probe card (first card) of Embodiment 1, and FIG. 7 is the cross-sectional view which went along the A-A line in FIG. 6.

As shown in FIG. 6 and FIG. 7, the probe card of Embodiment 1 is formed, for example from multilayer interconnection substrate (first wiring substrate) 1, thin films sheet (first sheet) 2, plunger 3, etc. Thin films sheet 2 is fixed to the under surface of multilayer interconnection substrate 1 with contact ring 4C and process ring 4P, and plunger 3 is attached to the upper surface of multilayer interconnection substrate 1. The opening was formed in the central part of multilayer interconnection substrate 1, and thin films sheet 2 is adhered on adhesion ring 6 in this opening.

A plurality of 4 pyramid type or 4 truncated pyramid shape type probes (contact terminal) 7 are formed in the under surface of thin films sheet 2, for example. In thin films sheet 2, a plurality of wirings (second wiring) which electrically connect with each of probe 7 and are extending and existing from each probe 7 to the depths of thin films sheet 2 are formed. A plurality of receptacle parts (illustration is omitted) which electrically contact the end portion of these wirings of a plurality of, respectively are formed in the under surface of multilayer interconnection substrate 1. These receptacle parts of a plurality of have electrically connected with a plurality of POGO seats 8 formed in the upper surface of multilayer interconnection substrate 1 through the wiring (first wiring) formed in multilayer interconnection substrate 1. This POGO seat 8 has the function to receive the pin which introduces the signal from a circuit tester to a probe card.

In Embodiment 1, thin films sheet 2 is formed from the thin film which uses polyimide as a principal component, for example, and has pliability. Plunger 3 pushes and presses thin films sheet 2 of the region (first region) in which probe 7 was formed via pressing tool (extrusion mechanism) 9 and elastomer 9A from the upper surface (back surface). By extruding pressing tool 9, thin films sheet 2 is extended, and the position at the tip of each probe 7 is adjusted so that it may become a position which faces with pad PD3 and PD4 to which each corresponds. Plunger 3 is fixed to case 12 with nut 11, and case 12 is fixed to load jig 14 with nut 13. Spring 3A is built in in plunger 3, and it has structure in which fixed thrust pushes and travels to pressing tool 9, elastomer 9A, and thin films sheet 2 via pin 3B according to the elastic force of this spring 3A. In Embodiment 1, as material of pressing tool 9, 42 alloys can be exemplified and a silicon sheet can be exemplified as elastomer 9A.

Multilayer interconnection substrate 1 and overhang ring 15 are connected via connection jig 17 by being attached to connection jig 17 with bolts 16A and 16B, respectively. Overhang ring 15 is used in order to make the region in which probe 7 was formed among thin films sheets 2 jut out from the under surface of multilayer interconnection substrate 1. Load jig 14 and adhesion ring 6 are connected with bolt 16C. Spring retaining jig 18 is attached to overhang ring 15 with bolt 16D, and spring (pressurizing mechanism) 19 is installed between spring retaining jig 18 and load jig 14 (bolt 16C). Although illustration is omitted, this spring 19 is arranged, for example in the plane of multilayer interconnection substrate 1 at about 8 places-12 places. The elastic force of spring 19 acts on load jig 14 (bolt 16C), when probe 7 contacts pad PD3 and PD4 at the time of a probe test and a probe card is pushed in toward pad PD3 and PD4. At this time, load jig 14, pressing tool 9, elastomer 9A, adhesion ring 6, and plunger 3 constitute one (pressurizing mechanism) by fixation with nuts 11 and 13 and bolt 16C. Therefore, the elastic force of spring 19 acts so that the member used as these one may be depressed toward pad PD3 and PD4. As a result, the thrust transmitted from spring 3A in plunger 3 to thin films sheet 2 will be used only for the extension of thin films sheet 2.

Figure 8:
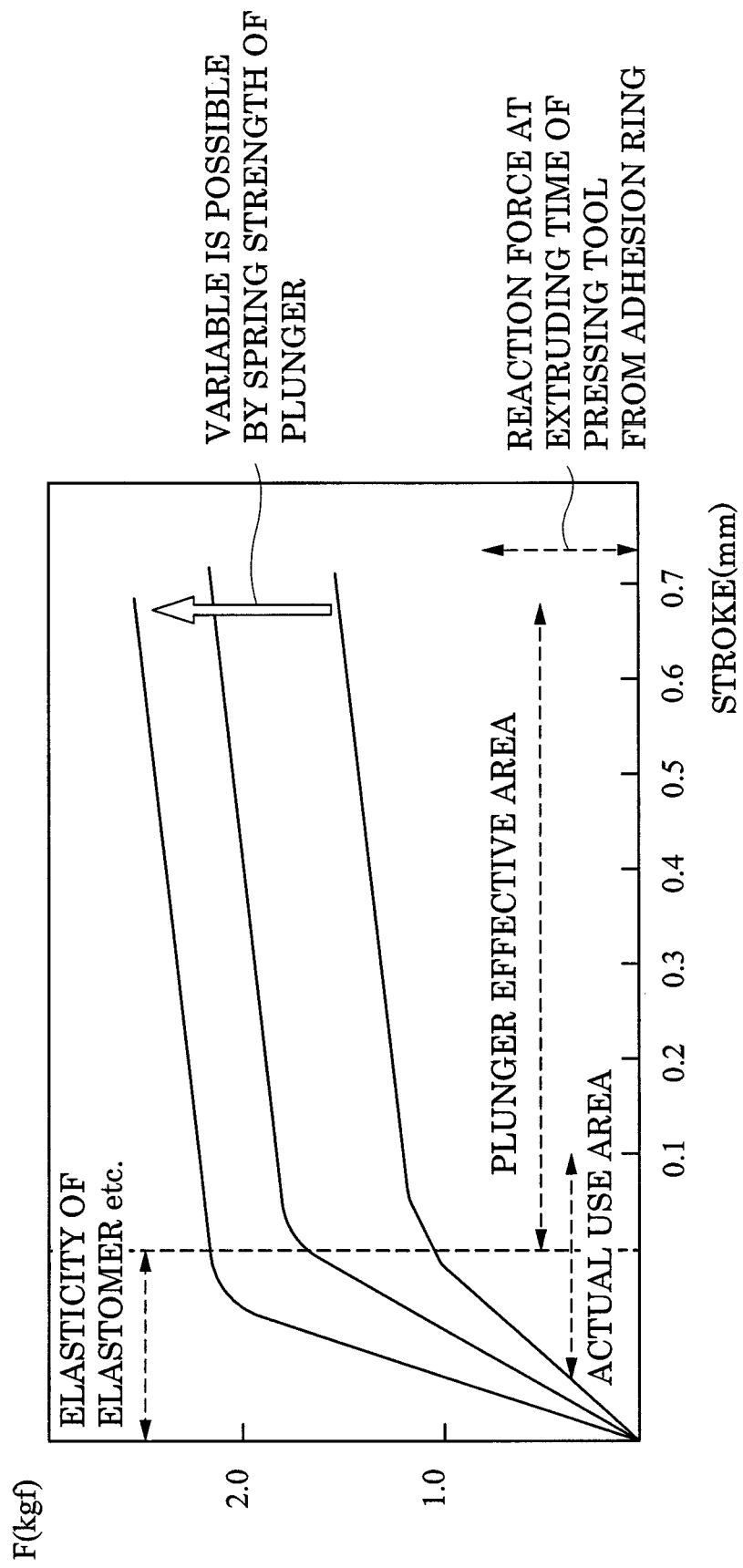
FIG. 8 is an explanatory diagram showing the relation between stroke quantity and load at the time of using the probe card in comparison with the probe card which is Embodiment 1 of the present invention.

Here, FIG. 8 shows the relation of the pushing quantity of probe 7 to pad PD3 and PD4 (it is hereafter described as stroke quantity) after probe 7 contacts pad PD3 and PD4 (refer to FIG. 3) and the load applied to all the pad PD3 and PD4 which are in contact with probe 7 when the probe card with which load jig 14 is fixed to multilayer interconnection substrate 1 and with which spring 19 is not attached is used. In this case, only plunger 3 will perform load control of pad PD3 and PD4. Stroke quantity is about 0.1 mm or less at the time of a probe test. However, as shown in FIG. 8, when it is a probe card with which spring 19 is not attached, when stroke quantity is about 0.1 mm or less, a load change is done with the elasticity of elastomer 9A etc., and load control by plunger 3 cannot be performed. The load by plunger 3 can also be set to about 1 kgf by choosing spring 3A of a suitable spring constant. However, as mentioned above, plunger 3 is used, also in order to extrude pressing tool 9 and to make thin films sheet 2 jut out from the under surface of multilayer interconnection substrate 1, and it becomes difficult to choose freely spring 3A with a small spring constant. That is, it is difficult to contact probe 7 to pad PD3 and PD4 by low load in actual use area of about 0.1 mm or less in stroke quantity.

Figure 9:
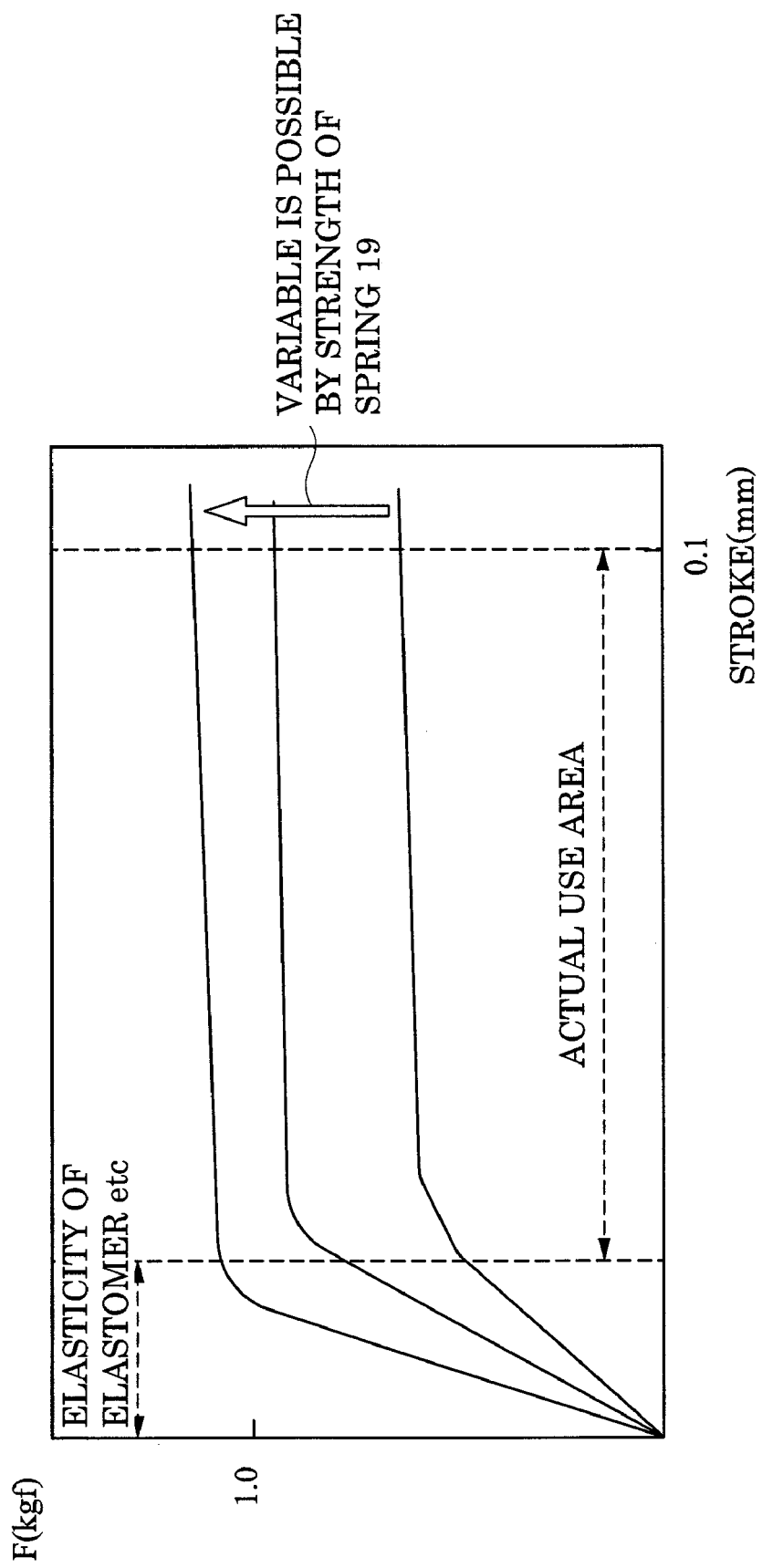
FIG. 9 is an explanatory diagram showing the relation between stroke quantity and load at the time of using the probe card which is Embodiment 1 of the present invention.

On the other hand, when the probe card of Embodiment 1 explained using FIG. 6 and FIG. 7 is used, as mentioned above, the thrust transmitted from spring 3A in plunger 3 to thin films sheet 2 is used only for the extension of thin films sheet 2. Therefore, as shown in FIG. 9, even when stroke quantity is about 0.1 mm or less, load control is possible at the strength of spring 19. That is, when the probe card of Embodiment 1 is used, in actual use area of about 0.1 mm or less in stroke quantity, probe 7 can be contacted to pad PD3 and PD4 by low load. The load can be less than 3 g per probe 7. It can realize per 0.1 g by arranging spring 19 of a spring constant which constitutes a desired load to adjust load.

According to the above probe cards of Embodiment 1, probe 7 can be contacted to pad PD3 and PD4 by low load. Therefore, even when chip CHP (refer to FIG. 3) has the structure (refer to FIG. 1) where the wiring and the element have been arranged also under pad PD3 and PD4, it can prevent the wiring and element being destroyed by the load at the time of probe 7 contacting pad PD3 and PD4 at the time of a probe test.

In order to do circuit operation early in chip CHP, when an insulating film with low mechanical strength and a low relative dielectric constant (for example, Low-k (low dielectric constant) insulating films whose relative dielectric constant is less than about 3.0 by CVD of a silica glass system, such as SiOC, or the Low-k insulating film by CVD of a carbon inclusion silicon oxide system, and not only CVD but the thing made into porosity by composition similar to these) is used as an interlayer insulation film between the upper wiring and a lower layer wiring, we are anxious about becoming easy to cause destruction of an insulating film or a circuit by the load at the time of a probe contacting pad PD3 and PD4 at the time of a probe test. However, by using the probe card of Embodiment 1, probe 7 can be contacted to pad PD3 and PD4 by low load, and it becomes possible to prevent such trouble.

Since probe 7 can be contacted to pad PD3 and PD4 by low load according to the probe card of Embodiment 1, the damage given to probe 7 when probes 7, and pad PD3 and PD4 contact can be decreased substantially.

Figure 10:
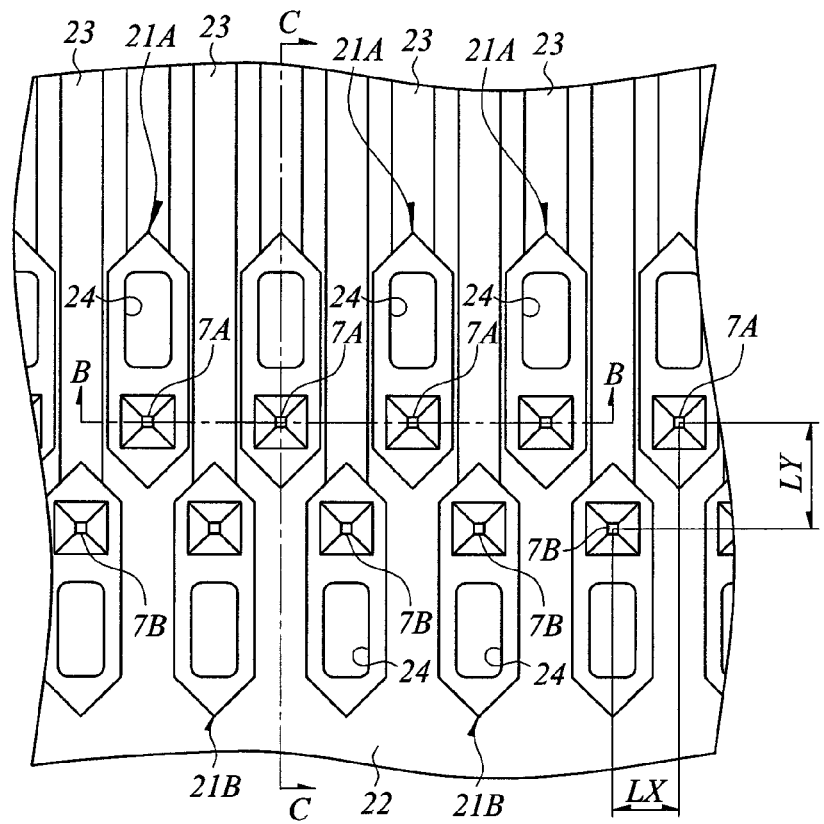
FIG. 10 is a principal part plan view of the thin films sheet which forms the probe card which is Embodiment 1 of the present invention.
Figure 11:
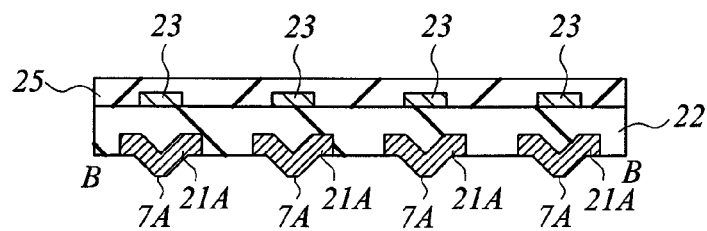
FIG. 11 is a cross-sectional view which went along the B-B line in FIG. 10.
Figure 12:
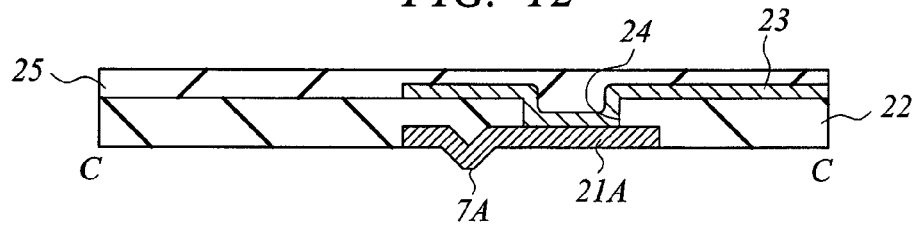
FIG. 12 is a cross-sectional view which went along the C-C line in FIG. 10.

FIG. 10 is a principal part plan view expanding and showing a part of region in which probe 7 was formed of the under surface of the above-mentioned thin films sheet 2, FIG. 11 is the principal part cross-sectional view which went along the B-B line in FIG. 10, and FIG. 12 is the principal part cross-sectional view which went along the C-C line in FIG. 10.

Figure 13:
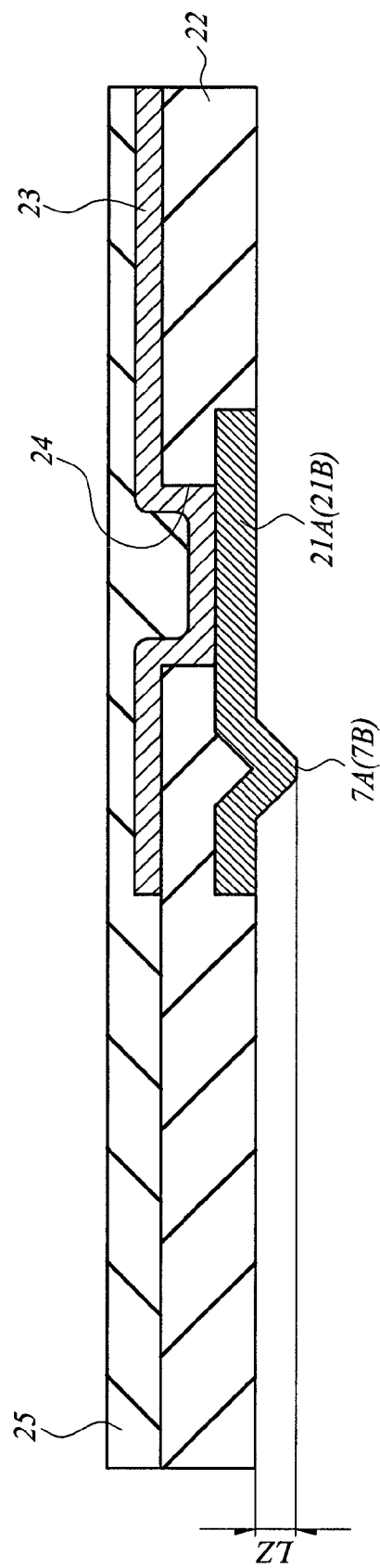
FIG. 13 is a cross-sectional view expanding and showing the principal part of the thin films sheet which forms the probe card which is Embodiment 1 of the present invention.

The above-mentioned probes 7 are a part of metallic films 21A and 21B patterned in the shape of a plane hexagon in thin films sheet 2, and are the portions which jumped out in 4 pyramid type or 4 truncated pyramid shapes type on the under surface of thin films sheet 2 of the metallic films 21A and 21B. Probe 7 is arranged according to the position of pad PD3 and PD4 which were formed in the above-mentioned chip CHP in the main surface of thin films sheet 2, and shows arrangement of probe 7 corresponding to pad PD3 by FIG. 10. Probe 7A corresponds to pad PD3 of the pad PD3 arranged by two rows of the arrangement (it is henceforth described as a first column) relatively near the periphery of chip CHP among these probes 7. Probe 7B corresponds to pad PD3 of the pad PD3 arranged by two rows of arrangement (it is henceforth described as a second column) relatively far from the periphery of chip CHP. The distance between probe 7A and probe 7B which exist in the nearest position is prescribed by distance LX of a horizontal direction and distance LY of an up-and-down direction of space FIG. 10 was indicated to be. Distance LX constitutes about 34 μm of the half of the above-mentioned pitch LP by which adjacent pad PD3 is arranged. In Embodiment 1, distance LY constitutes about 93 μm. As shown in FIG. 13, height LZ (needle height) from the front surface of polyimide film 22 to the tip of probes 7A and 7B is arranged below by 50 μm (greatly below 90 μm), and is arranged below by 30 μm still more desirably.

For example from the lower layer, a rhodium film and a nickel film laminate one by one, and metallic films 21A and 21B are formed. Polyimide film 22 is formed on metallic film 21A and 21B, and wiring (second wiring) 23 which electrically connects with each metallic film 21 is formed on polyimide film 22. Wiring 23 touches metallic films 21A and 21B at the bottom of through hole 24 formed in polyimide film 22. Polyimide film 25 is formed on polyimide film 22 and wiring 23.

As described above, a part of metallic films 21A and 21B constitute probes 7A and 7B formed in 4 pyramid type or 4 truncated pyramid shapes type, and through hole 24 which reaches metallic films 21A and 21B is formed in polyimide film 22. Therefore, when the plane pattern of metallic film 21A with which probe 7A was formed, and through hole 24, and the plane pattern of metallic film 21B with which probe 7B was formed, and through hole 24 are arranged in the same direction, adjacent metallic film 21A and adjacent metallic film 21B contact, and we are anxious about the trouble of it becoming impossible to acquire the input/output which became independent, respectively from probes 7A and 7B. So, as shown in FIG. 10, in Embodiment 1, the plane pattern of metallic film 21B with which probe 7B was formed, and through hole 24 is set as the pattern which 180°-rotated the plane pattern of metallic film 21A with which probe 7A was formed, and through hole 24. Thereby, the broad region of metallic film 21A with which probe 7A and through hole 24 have been arranged at the plane, and the broad region of metallic film 21B with which probe 7B and through hole 24 have been arranged at the plane cease to be arranged on the straight line of the horizontal direction of space. The region of the shape of a plane forward tapered shape of metallic film 21A and metallic film 21B comes to be arranged on the straight line of the horizontal direction of space. As a result, the trouble that adjacent metallic film 21A and adjacent metallic film 21B will contact can be prevented. Even if pad PD3 is arranged with a narrow pitch, it becomes possible to arrange probes 7A and 7B in the position corresponding to it.

Figure 14:
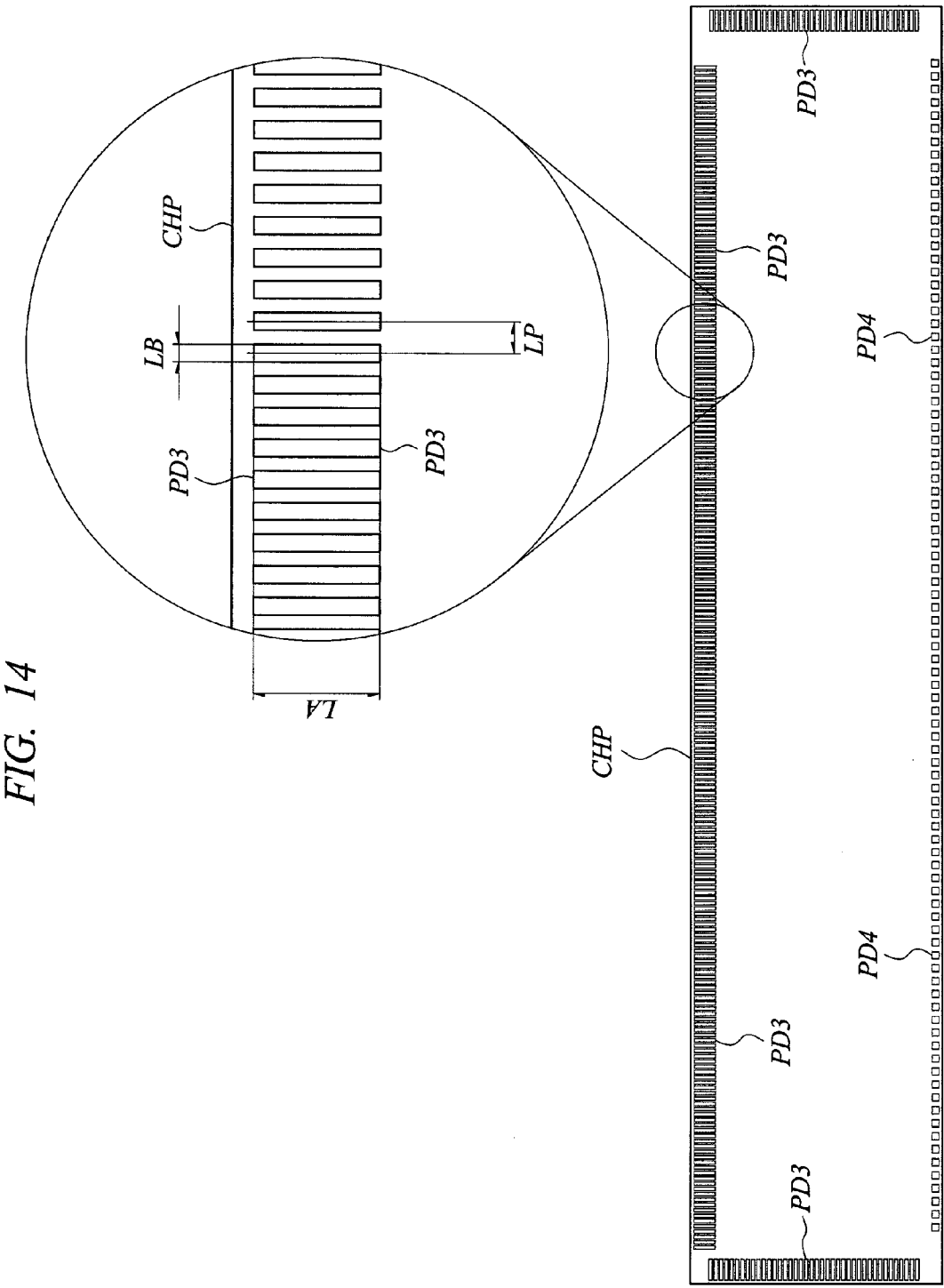
FIG. 14 is a plan view of the semiconductor chip of the object which conducts a probe test using the probe card which is Embodiment 1 of the present invention.
Figure 15:
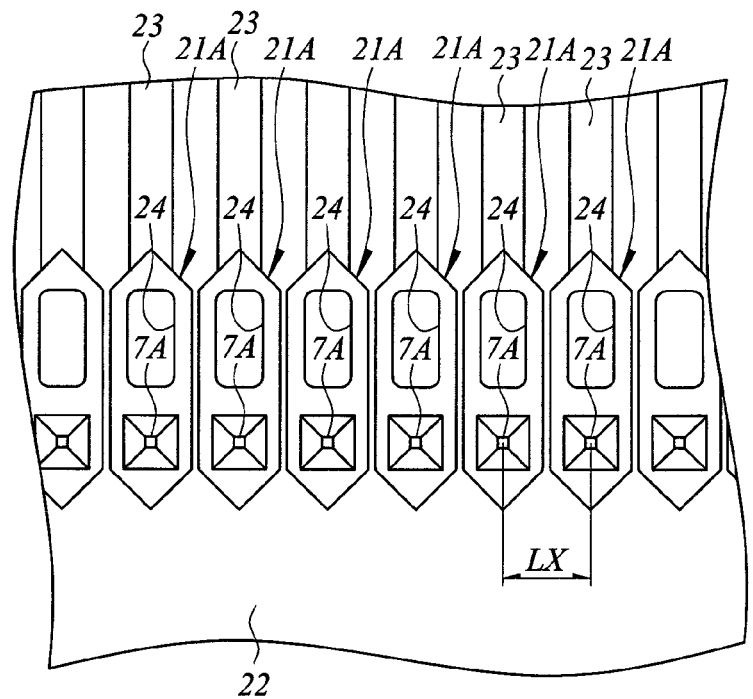
FIG. 15 is a principal part plan view of the thin films sheet which forms the probe card which is Embodiment 1 of the present invention.
Figure 16:
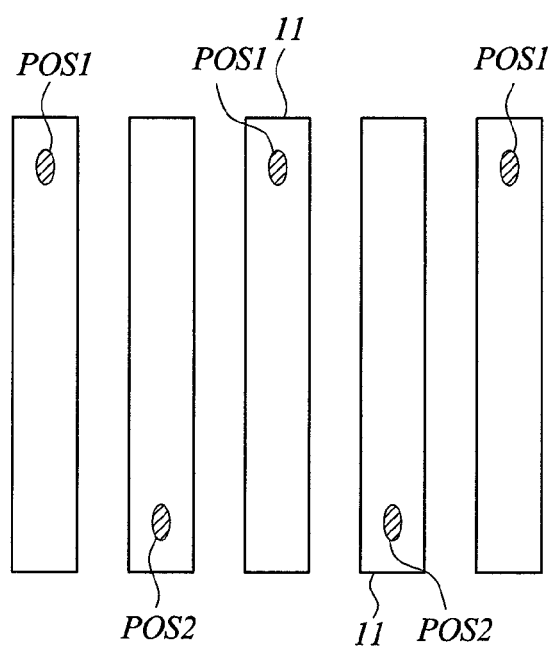
FIG. 16 is a principal part plan view showing the position which a probe contacts on the bump electrode formed in the semiconductor chip of the object which conducts a probe test using the probe card which is Embodiment 1 of the present invention.

Although Embodiment 1 explained the case where pad PD3 was arranged by two rows using FIG. 3, as shown in FIG. 14, the chip arranged by one row also exists. To such a chip, as shown in FIG. 15, it can deal with by using thin films sheet 2 with which the broad region of the above-mentioned metallic film 21A has been arranged on the straight line of the horizontal direction of space. When pad PD3 is arranged by one row in this way, and for example length LA of the long side extending and existing in the direction which intersects (rectangularly crosses) the periphery of chip CHP is about 140 μm, the length LB of the short side extending and existing along the periphery of chip CHP is about 19 μm, pitch LP by which adjacent pad PD3 is arranged is about 34 μm, and the gap of adjacent pad PD3 is about 15 μm, a long side becomes more than about double comparing with pad PD3 shown in FIG. 3 and the centre position of pad PD3 in a short side direction can be arranged with the centre position of pad PD3 shown in FIG. 3. Therefore, it becomes possible to use thin films sheet 2 explained using FIG. 10-FIG. 12, and each of probes 7A and 7B will contact pad PD3 by position POS1 and POS2 which are shown in FIG. 16.

Figure 17:
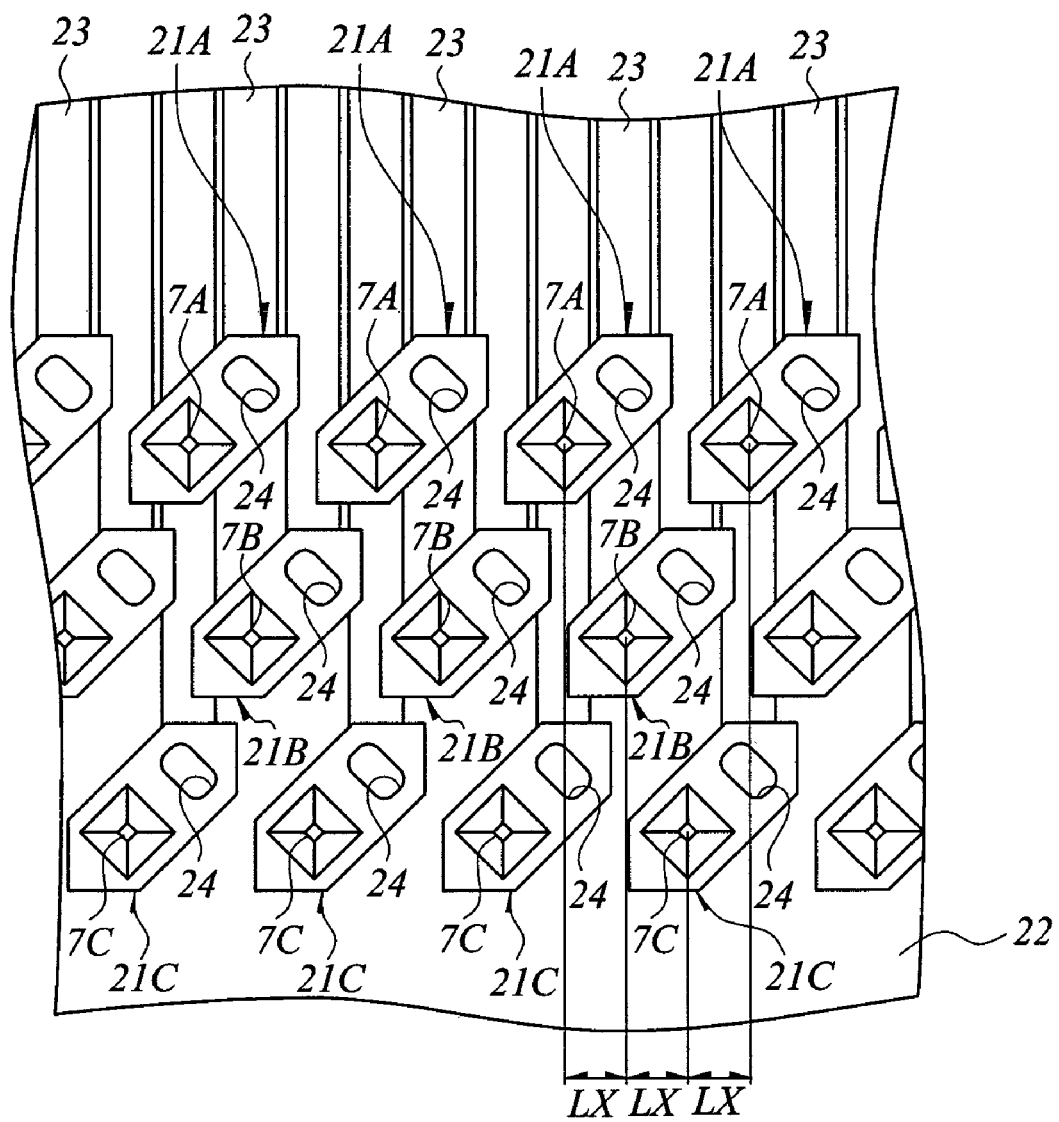
FIGS. 17 and 18 are principal part plan views of the thin films sheet which forms the probe card which is Embodiment 1 of the present invention.
Figure 18:
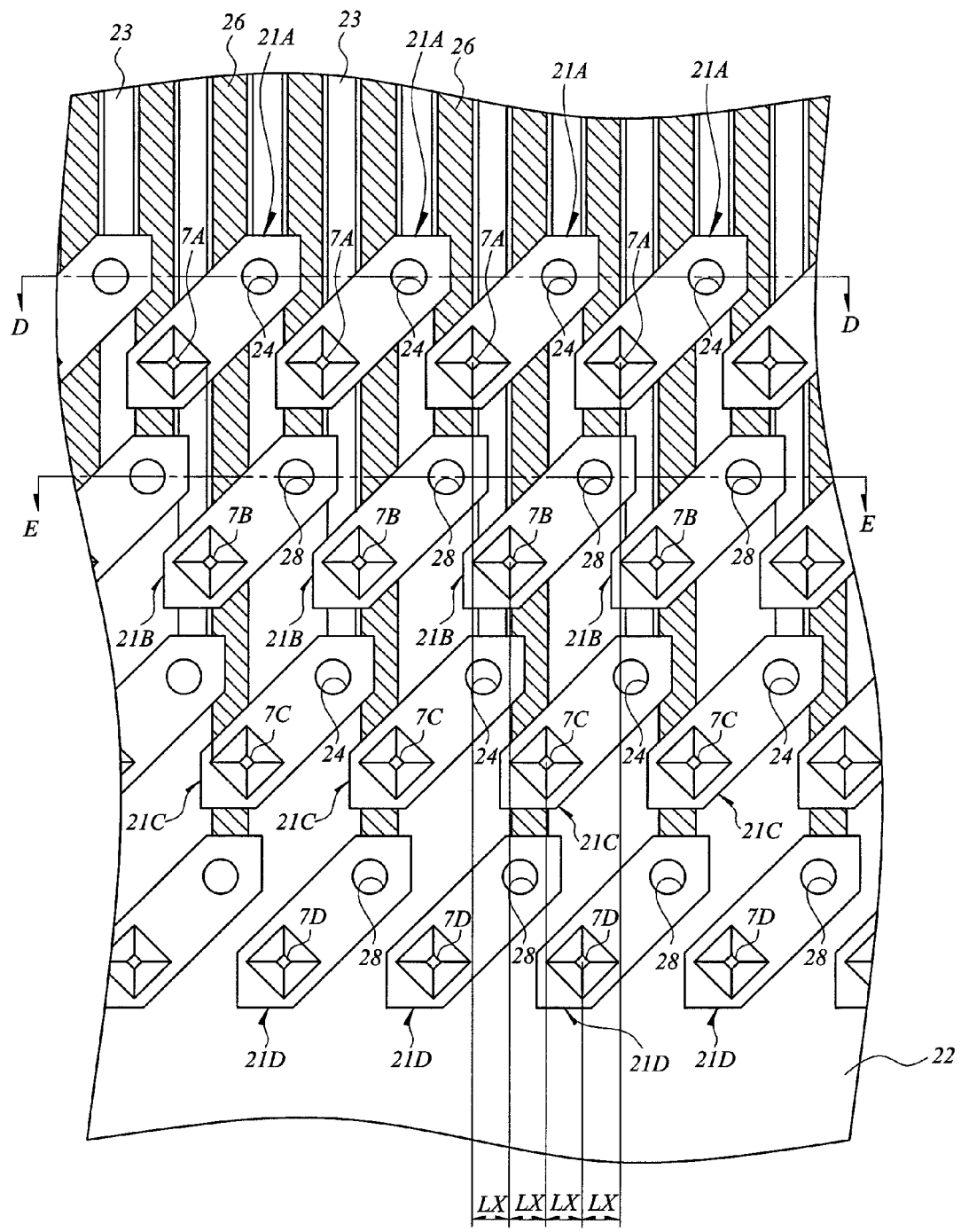

When there are still more pad PD3, it may be arranged by three or more rows. FIG. 17 is a principal part plan view of thin films sheet 2 corresponding to pad PD3 arranged by three rows, and FIG. 18 is a principal part plan view of thin films sheet 2 corresponding to pad PD3 arranged by four rows. Since distance LX explained using FIG. 10 will become still narrower as the number of arrangement of pad PD3 increases when the size of chip CHP is the same, we are further anxious about a metallic film including the above-mentioned metallic films 21A and 21B contacting. Then, by making metallic films 21A, 21B, 21C, and 21D into for example, the thing which 45°-rotated the plane pattern of metallic film 21A shown in FIG. 10 as shown in FIG. 17 and FIG. 18, it becomes possible to prevent the trouble that metallic films 21A, 21B, 21C, and 21D will contact mutually. The example which 45°-rotated the plane pattern of metallic film 21A shown in FIG. 10 here was explained. However, it may not limit to 45°, and as long as it can prevent mutual contact of metallic films 21A, 21B, 21C, and 21D, other angles of rotation are sufficient. Probe 7C corresponding to pad PD3 further arranged at the inside in chip CHP from pad PD3 to which probe 7B corresponds is formed in metallic film 21C. Probe 7D corresponding to pad PD3 further arranged at the inside in chip CHP from pad PD3 to which probe 7C corresponds is formed in metallic film 21D.

Figure 19:
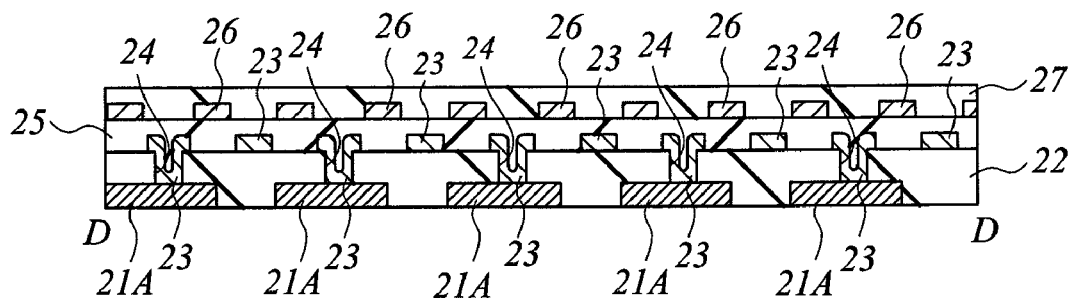
FIG. 19 is a cross-sectional view which went along the D-D line in FIG. 18.
Figure 20:
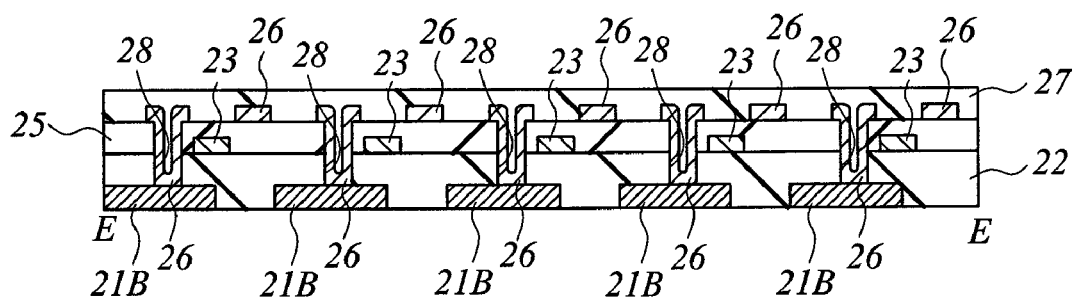
FIG. 20 is a cross-sectional view which went along the E-E line in FIG. 18.

FIG. 19 is the principal part cross-sectional view which went along the D-D line in FIG. 18 here, and FIG. 20 is the principal part cross-sectional view which went along the E-E line in FIG. 18. As shown in FIG. 18, when metallic films 21A-21D which have probes 7A-7D corresponding to pad PD of four rows 3 have been arranged, it becomes difficult to form all the wirings that electrically connect with each of metallic films 21A-21D from the upper layer in the same wiring layer. This is because a possibility that the wirings electrically connected to metallic films 21A-21D may contact occurs with a possibility that each of metallic films 21A-21D may contact occurring, when the above-mentioned distance LX becomes narrow. Then, in Embodiment 1, as shown in FIG. 19 and FIG. 20, it can exemplify forming these wirings from a two-layer wiring layer (wirings 23 and 26). Polyimide film 27 is formed on wiring 26 and polyimide film 25. Wiring 23 of a relatively lower layer touches metallic films 21A and 21C at the bottom of through hole 24 formed in polyimide film 22. Wiring 26 which is a relatively upper layer touches metallic films 21B and 21D at the bottom of through hole 28 formed in polyimide films 22 and 25. Thereby, in the same wiring layer, it becomes possible to secure greatly the adjacent gap of wiring 23 or wiring 26, and the trouble that adjacent wiring 23 or adjacent wiring 26 will contact can be prevented. When pad PD3 becomes five or more rows, the number of probes corresponding to it increases and the above-mentioned distance LX becomes narrow, a wiring interval may be extended by forming a wiring layer in a multilayer further.

Next, it combines with the manufacturing process and the structure of thin films sheet 2 of the above-mentioned Embodiment 1 is explained using FIG. 21-FIG. 27. FIG. 21-FIG. 27 are the principal part cross-sectional views in the manufacturing process of thin films sheet 2 which has probes 7A and 7B corresponding to pad PD of two rows 3 (refer to FIG. 3) explained using FIG. 10-FIG. 12.

Figure 21:
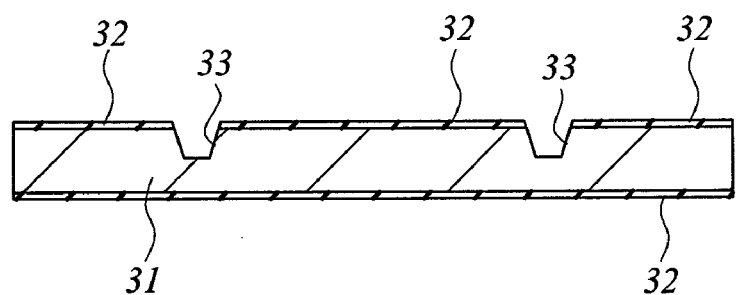
FIG. 21 is a principal part cross-sectional view explaining the manufacturing process of the thin films sheet which forms the probe card which is Embodiment 1 of the present invention.

First, as shown in FIG. 21, wafer 31 of thickness of about 0.2 mm~0.6 mm which consists of silicon is prepared, and silicon oxide film 32 of thickness of about 0.5 μm is formed in both faces of this wafer 31 by a thermal oxidation method. Then, silicon oxide film 32 at the side of the main surface of wafer 31 is etched by using a photoresist film as a mask, and the opening which reaches wafer 31 is formed in silicon oxide film 32 at the side of the main surface of wafer 31. Subsequently, the remaining silicon oxide film 32 is used as a mask, and wafer 31 is etched unisotropically with strong alkali solution (for example, potassium hydroxide solution). This forms in the main surface of wafer 31 hole 33 of 4 pyramid type or 4 truncated pyramid shapes type surrounded by the surface (111).

Figure 22:
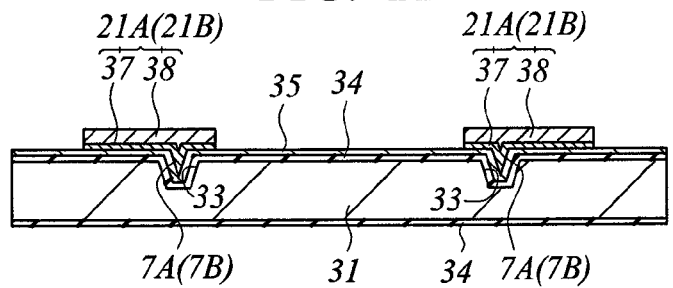
FIG. 22 is a principal part cross-sectional view in the manufacturing process of the thin films sheet following FIG. 21.

Next, as shown in FIG. 22, the wet etching by the mixed solution of fluoric acid and ammonium fluoride removes silicon oxide film 32 used as a mask at the time of formation of the above-mentioned hole 33. Then, silicon oxide film 34 of thickness of about 0.5 μm is formed in all surface of wafer 31 including the inside of hole 33 by performing thermal oxidation processing to wafer 31. Subsequently, conductive film 35 is formed to the main surface of wafer 31 comprising the inside of hole 33. This conductive film 35 can be formed by for example, depositing the chromium film of thickness of about 0.1 μm, and the copper film of thickness of about 1 μm with the sputtering method or vacuum evaporation method one by one. Subsequently, on conductive film 35, a photoresist film is formed, with photolithography technology, the photoresist film of the region in which metallic films 21A and 21B (refer to FIG. 10-FIG. 12) are formed at a later step is removed, and an opening is formed.

Next, conductive film 37 with high hardness and conductive film 38 are deposited one by one with the electrolysis electroplating method which used conductive film 35 as the electrode on conductive film 35 which appeared in the bottom of the opening of the above-mentioned photoresist film. In Embodiment 1, it can exemplify using conductive film 37 as a rhodium film, and using conductive film 38 as a nickel film. According to the step so far, the above-mentioned metallic films 21A and 21B can be formed from conductive films 37 and 38. Conductive films 37 and 38 in hole 33 constitute the above-mentioned probes 7A and 7B. Although removed at a later step, the step is later mentioned for conductive film 35.

In metallic films 21A and 21B, when the above-mentioned probes 7A and 7B are formed at a later step, conductive film 37 formed from the rhodium film constitutes a front surface, and conductive film 37 will do direct contact to pad PD3. Therefore, it is preferred to choose the material whose hardness is high and which was excellent in wear and abrasion resistance as conductive film 37. Since direct contact of the conductive film 37 is done to pad PD3, when the waste of pad PD3 shaved off by probes 7A and 7B adheres to conductive film 37, the cleaning process which removes the waste will be needed, and we will be anxious about a probe test step being prolonged. Therefore, it is preferred to choose the material to which the material which forms pad PD3 does not adhere easily as conductive film 37. Then, in Embodiment 1, the rhodium film which satisfies these conditions is chosen as conductive film 37. Thereby, the cleaning process can be skipped.

Figure 23:
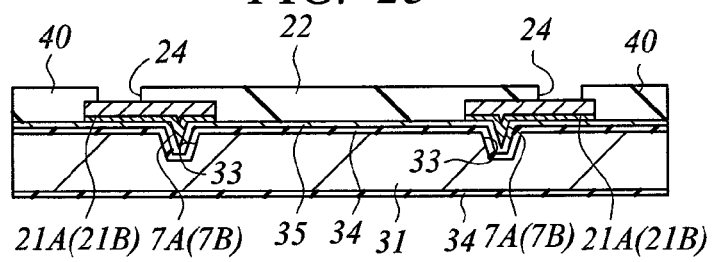
FIG. 23 is a principal part cross-sectional view in the manufacturing process of the thin films sheet following FIG. 22.

Next, after removing the photoresist film used for film formation of the above-mentioned metallic films 21A and 21B (conductive films 37 and 38), as shown in FIG. 23, polyimide film 22 (also see FIG. 11 and FIG. 12) is formed so that metallic films 21A and 21B and conductive film 35 may be covered. Then, the above-mentioned through hole 24 which reaches metallic films 21A and 21B is formed in the polyimide film 22. This through hole 24 can be formed by opening processing using laser, or the dry etching which used the aluminum film as the mask.

Figure 24:
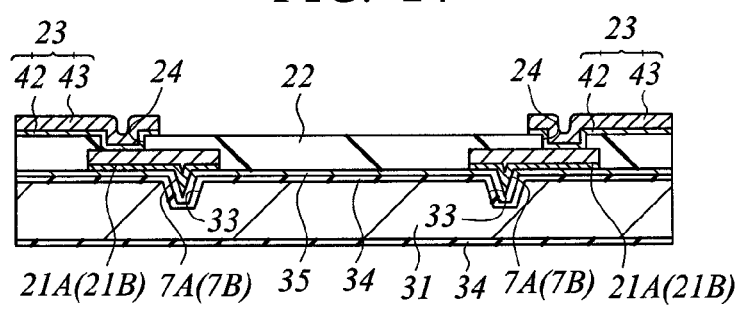
FIG. 24 is a principal part cross-sectional view in the manufacturing process of the thin films sheet following FIG. 23.

Next, as shown in FIG. 24, conductive film 42 is formed on polyimide film 22 comprising the inside of through hole 24. This conductive film 42 can be formed by for example, depositing the chromium film of thickness of about 0.1 μm, and the copper film of thickness of about 1 μm with the sputtering method or vacuum evaporation method one by one. Then, after forming a photoresist film on the conductive film 42, the photoresist film is patterned with photolithography technology, and the opening which reaches conductive film 42 is formed in a photoresist film. Subsequently, conductive film 43 is formed on conductive film 42 in the opening with an electroplating method. In Embodiment 1, a copper film, or the laminated film which deposited the copper film and the nickel film one by one from the lower layer can be exemplified as conductive film 43.

Figure 25:
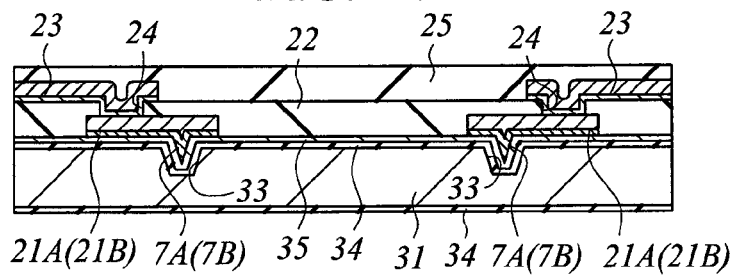
FIG. 25 is a principal part cross-sectional view in the manufacturing process of the thin films sheet following FIG. 24.

Next, after removing the above-mentioned photoresist film, wiring 23 which consists of conductive films 42 and 43 is formed by etching conductive film 42 by using conductive film 43 as a mask. Wiring 23 is electrically connectable with metallic films 21A and 21B at the bottom of through hole 24. Subsequently, as shown in FIG. 25, the above-mentioned polyimide film 25 is formed to the main surface of wafer 31.

Figure 26:
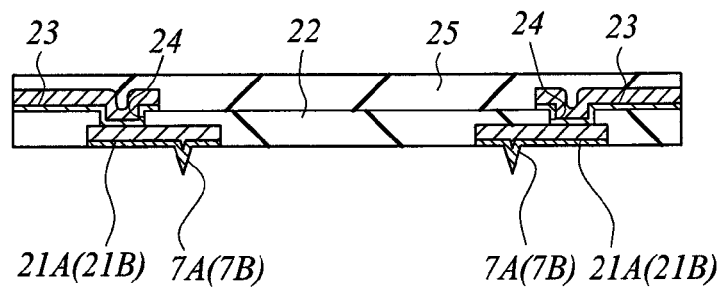
FIG. 26 is a principal part cross-sectional view in the manufacturing process of the thin films sheet following FIG. 25.

Next, as shown in FIG. 26, etching using the mixed solution of fluoric acid and ammonium fluoride removes silicon oxide film 34 of the back surface of wafer 31. Then, by etching using strong alkali solution (for example, potassium hydroxide solution), wafer 31 which is a mold material for forming thin films sheet 2 is removed, and thin films sheet 2 of Embodiment 1 is manufactured. Subsequently, etching removes silicon oxide film 34 and conductive film 35 one by one. At this time, silicon oxide film 34 is etched using the mixed solution of fluoric acid and ammonium fluoride. The chromium film included in conductive film 35 is etched using potassium permanganate solution, and the copper film included in conductive film 35 is etched using an alkaline copper etching solution. According to the step so far, the rhodium film which is conductive film 37 (refer to FIG. 22) which forms probes 7A and 7B appears in the front surface of probes 7A and 7B. As mentioned above, in probes 7A and 7B with which the rhodium film was formed in the front surface, Au which is the material of pad PD3 with which probes 7A and 7B contact does not adhere easily, hardness is higher than Ni, it is hard to oxidize, and contact resistance can be stabilized.

Figure 27:
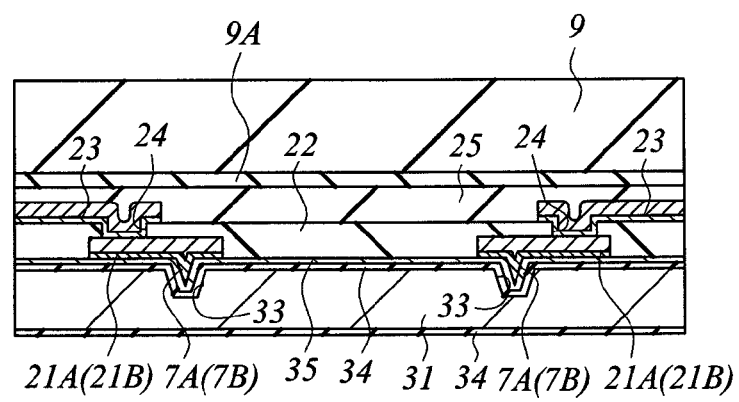
FIG. 27 is a principal part cross-sectional view in the manufacturing process of the thin films sheet which forms the probe card which is Embodiment 1 of the present invention.
Figure 28:
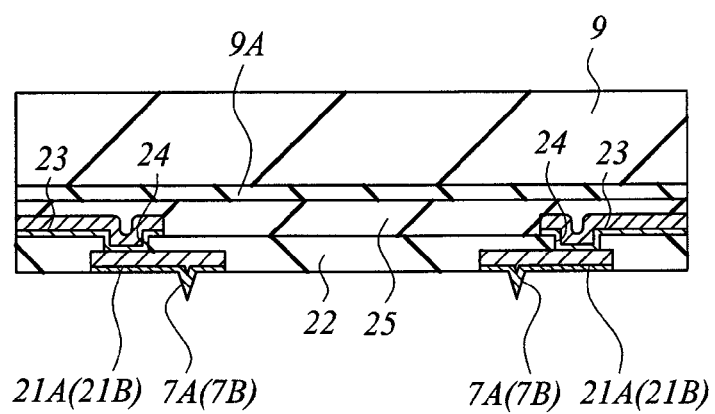
FIG. 28 is a principal part cross-sectional view in the manufacturing process of the thin films sheet following FIG. 27.

By the way, pressing tool 9 and elastomer 9A which were explained using FIG. 7 may be stuck on thin films sheet 2 under manufacture. As shown in FIG. 27, elastomer 9A and pressing tool 9 are stuck on the front surface of polyimide film 25 one by one after film formation of the above-mentioned polyimide film 25 using the adhesives made of epoxy system resin. Thin films sheet 2 is manufactured through the step explained using FIG. 26 after that (refer to FIG. 28). Thus, when pressing tool 9 and elastomer 9A are stuck on thin films sheet 2 under manufacture, since pressing tool 9 is formed from 42 alloys whose coefficient of linear expansion is close to silicon which forms chip CHP, each probe 7 is formed beforehand so that it may become a position which faces with corresponding pad PD3 and corresponding PD4. Thereby, when thin films sheet 2 is attached to a probe card, it becomes possible to skip the step which extends thin films sheet 2 by extruding pressing tool 9, and adjusts the position at the tip of each probe 7 so that it may become a position which faces with pad PD3 and PD4 to which each corresponds.

Embodiment 2

Embodiment 2 makes other structures thin films sheet 2 (refer to FIG. 7) explained also by the Embodiment 1.

Figure 29:
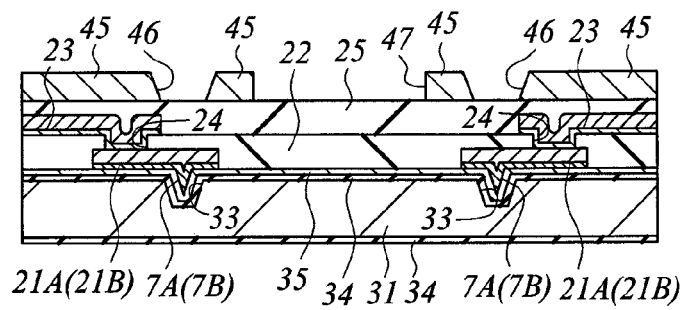
FIG. 29 is a principal part cross-sectional view in the manufacturing process of the thin films sheet which forms the probe card which is Embodiment 2 of the present invention.

The steps of the manufacturing process of thin films sheet 2 of Embodiment 2 are the same as until the steps explained using FIG. 21-FIG. 25 in the Embodiment 1. Then, as shown in FIG. 29, metal sheet 45 is adhered to the upper surface of polyimide film 25. At this time, polyimide film 25 functions as an adhesive layer of metal sheet 45. As this metal sheet 45, the material whose coefficient of linear expansion is low, and is close to the coefficient of linear expansion of wafer 31 formed from silicon is chosen. In Embodiment 2, 42 alloys (the alloy of nickel 42% and 58% of iron, and coefficient-oflinear-expansion 4 ppm/° C.) or Invar (the alloy of nickel 36% and 64% of iron, and coefficient-of-linear-expansion 1.5 ppm/° C.) can be exemplified, for example. The silicon film of the same material as wafer 31 may be formed instead of using metal sheet 45. The material which has a coefficient of linear expansion being comparable as silicon, for example, the alloy of iron, nickel, and cobalt, the mixed material of ceramics and resin, etc. are sufficient. In order to adhere, it is piled up doing alignment of such a metal sheet 45 to the main surface of wafer 31. It is realizable by doing heating pressurization compression bonding by heating at the temperature more than the glass transition point temperature of polyimide film 25, pressurizing by 10~200 kgf/cm$^2$ grade.

By adhering such a metal sheet 45 using polyimide film 25, improvement in the strength of thin films sheet 2 formed can be aimed at. In the case of not adhering metal sheet 45, by the expansion or contraction of thin films sheet 2, and a wafer to be examined resulting from the temperature at the time of a probe test, the relative position of probes 7A and 7B and corresponding pad PD3 will shift, and we are anxious about the trouble that it will become impossible for probes 7A and 7B to contact corresponding pad PD3. On the other hand, according to Embodiment 2, the expanding quantity or the shrinkage amount of thin films sheet 2, and a wafer to be examined resulting from the temperature at the time of a probe test can be arranged by having adhered metal sheet 45. Thereby, it becomes possible to prevent the relative position of probes 7A and 7B and corresponding pad PD3 shifting. That is, it becomes possible for probes 7A and 7B and corresponding pad PD3 to always maintain electric contact regardless of the temperature at the time of a probe test. It becomes possible to secure the relative accuracy of position of thin films sheet 2, and the wafer to be examined under various situations.

Next, metal sheet 45 is etched by using as a mask the photoresist film patterned by photolithography technology, and opening 46 is formed in metal sheet 45 on probes 7A and 7B. Opening 47 is formed in metal sheet 45 on the region between metallic films 21A or between metallic films 21B at a plane. In Embodiment 2, this etching can be set as spray etching which used the ferric chloride solution.

Figure 30:
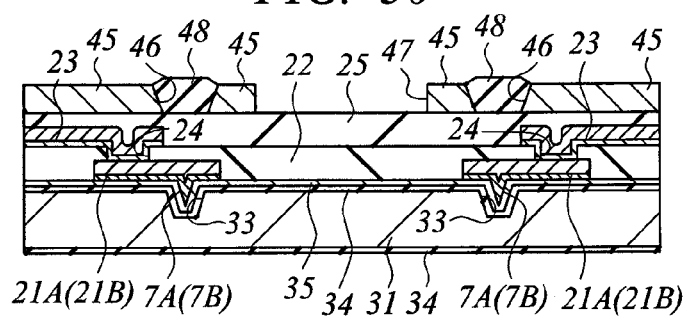
FIG. 30 is a principal part cross-sectional view in the manufacturing process of the thin films sheet following FIG. 29.

Next, after removing the above-mentioned photoresist film, as shown in FIG. 30, elastomer 48 is formed in opening 46. At this time, elastomer 48 is formed so that predetermined quantity may come out to the upper part of opening 46. In Embodiment 2, the method of printing or dispenser applying elastic resin, or the method of installing a silicon sheet can be exemplified in opening 46 as a method of forming elastomer 48. Elastomer 46 absorbs the variation in the height at the tip of each probes 7A and 7B according to local deformation, easing the impact at the time of the tip of many probes 7A and 7B contacting pad PD3. Uniform interlocking which imitated the variation in the height of pad PD3 realizes contact of probes 7A and 7B and pad PD3.

Figure 31:
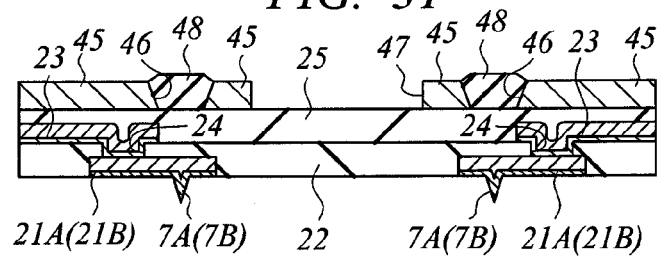
FIG. 31 is a principal part cross-sectional view in the manufacturing process of the thin films sheet following FIG. 30.

Next, as shown in FIG. 31, silicon oxide film 34 of two layers, wafer 31, and conductive film 35 are removed like the step explained using FIG. 26 in the Embodiment 1.

Figure 32:
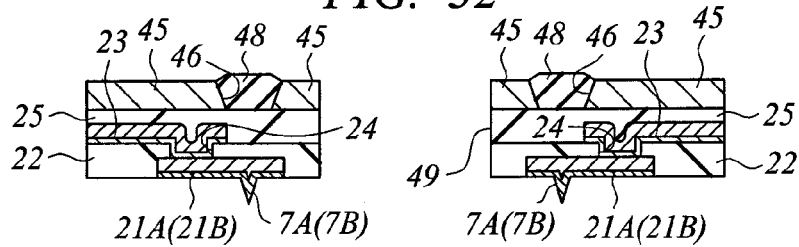
FIG. 32 is a principal part cross-sectional view in the manufacturing process of the thin films sheet following FIG. 31.
Figure 33:
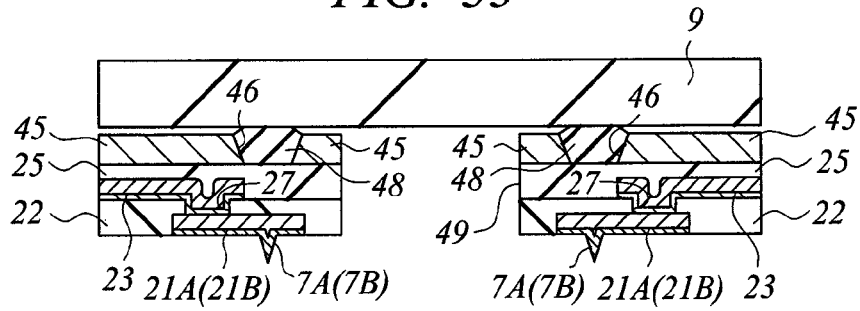
FIG. 33 is a principal part cross-sectional view in the manufacturing process of the thin films sheet following FIG. 32.

Next, as shown in FIG. 32, polyimide films 25 and 22 under opening 47 are removed, and opening 49 is formed. This opening 49 can be formed by opening processing using laser, or the dry etching which used metal sheet 45 and elastomer 48 as the mask. Then, as shown in FIG. 33, pressing tool 9 explained also by the Embodiment 1 is pasted up on elastomer 48, and thin films sheet 2 of Embodiment 2 is manufactured.

Figure 34:
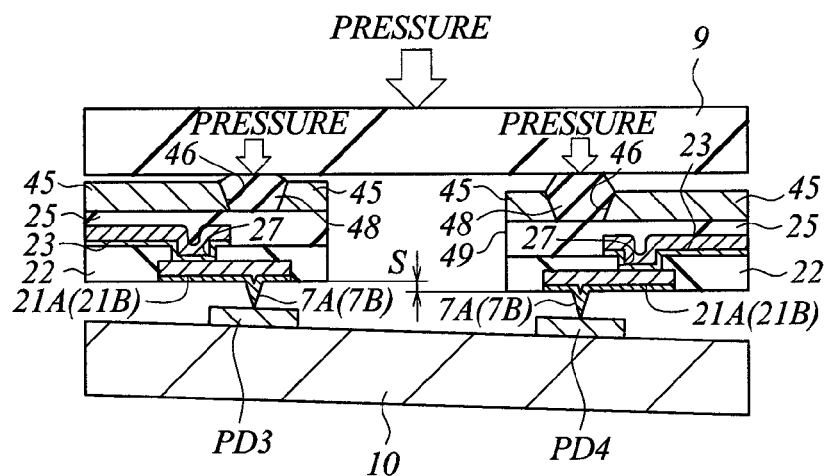
FIGS. 34 and 35 are principal part cross-sectional views explaining contact with the probe which the thin films sheet which forms the probe card which is Embodiment 2 of the present invention has, and the pad of a semiconductor chip.

When metal sheet 45 adhered, rigidity of thin films sheet 2 of the Embodiment 2 manufactured according to the above-mentioned step is improving. As shown in FIG. 34, when a warp has occurred to the wafer (chip CHP) to be examined, difference S will occur between the height of pad PD3, and the height of pad PD4. Therefore, when such a difference S has occurred, we will be anxious about the generation of the trouble of it becoming impossible to contact pad PD4 of relatively low height to probes 7A and 7B. However, as for thin films sheet 2, the rigidity in this opening 49 falls by forming opening 49 between metallic films 21A (between metallic films 21B). Thereby, when pressure is applied with pressing tool 9 at the time of a probe test, a level difference can also be given to thin films sheet 2 by opening 49 within the limits of the elastic deformation of elastomer 48. As a result, since a level difference which cancels the above-mentioned difference S can be produced to thin films sheet 2, it becomes possible to contact surely all the probes 7A and 7B to pad PD3 and PD4.

Figure 35:
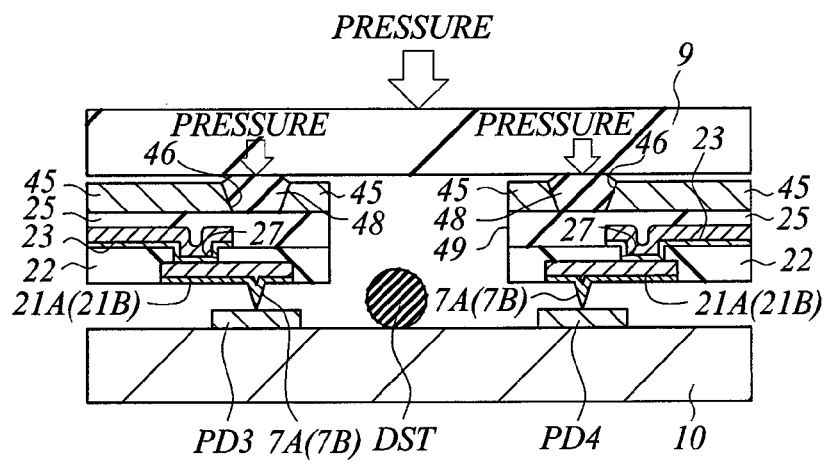

As shown in FIG. 35, when foreign substance DST has adhered to the main surface of a wafer (chip CHP) to be examined and the above-mentioned opening 49 is not formed in thin films sheet 2, and when it is going to contact probes 7A and 7B to pad PD3 and PD4, thin films sheet 2 runs aground on foreign substance DST, and we are anxious about the generation of the trouble of it becoming impossible to contact pad PD3 and PD4 to probes 7A and 7B. We are anxious also about thin films sheet 2 deforming, when thin films sheet 2 runs aground on foreign substance DST. When foreign substance DST exists near the probes 7A and 7B especially, we are anxious also about the generation of the trouble that probes 7A and 7B will sink into the inside of thin films sheet 2. However, since foreign substance DST can be located in opening 49 at a plane by having formed the above-mentioned opening 49, it becomes possible to fall the probability of a generation of these trouble.

Here, the plane pattern of the above-mentioned opening 49 is explained. FIG. 36, FIG. 38, FIG. 40, FIG. 42, and FIG. 44 are the principal part plan views of the under surface of thin films sheet 2. FIG. 37, FIG. 39, FIG. 41, FIG. 43, and FIG. 45 are the principal part cross-sectional views which went along the F-F line in FIG. 36, FIG. 38, FIG. 40, FIG. 42, and FIG. 44, respectively.

Figure 36:
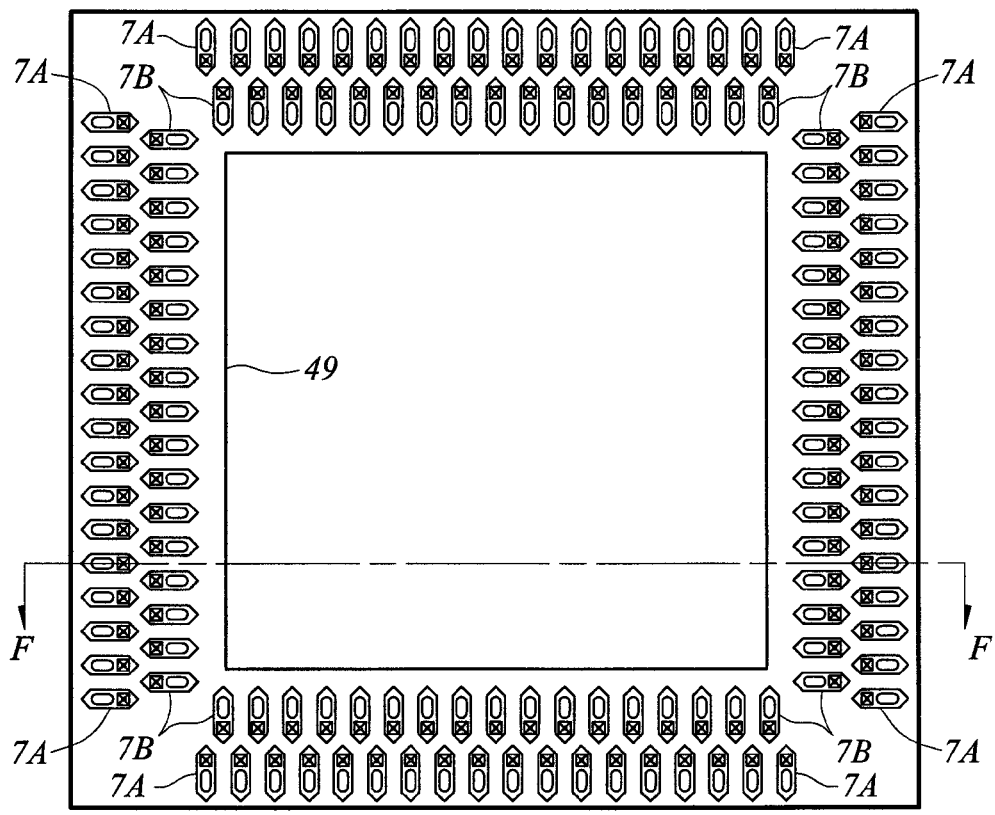
FIG. 36 is a principal part plan view of the thin films sheet which forms the probe card which is Embodiment 2 of the present invention.
Figure 37:
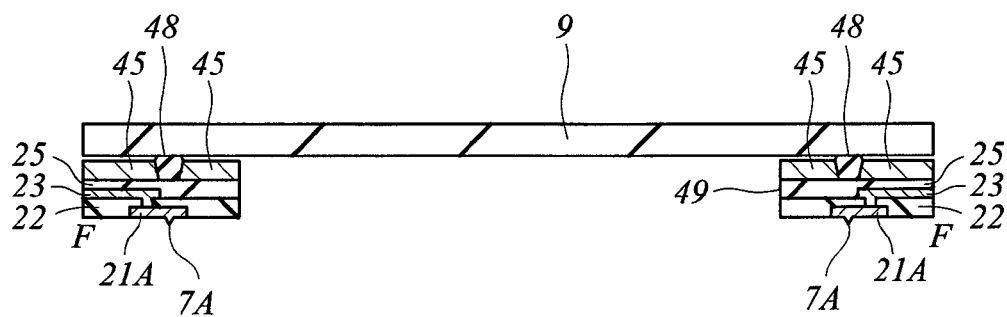
FIG. 37 is a principal part cross-sectional view which went along the F-F line in FIG. 36.
Figure 38:
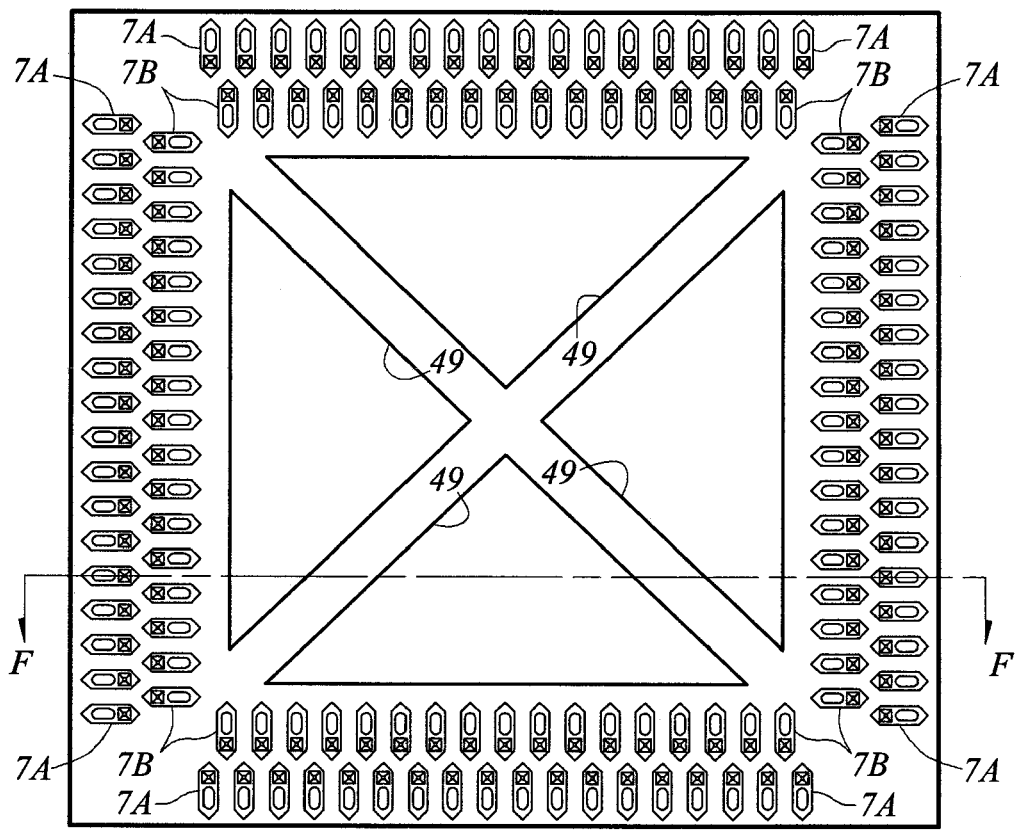
FIG. 38 is a principal part plan view of the thin films sheet which forms the probe card which is Embodiment 2 of the present invention.
Figure 39:
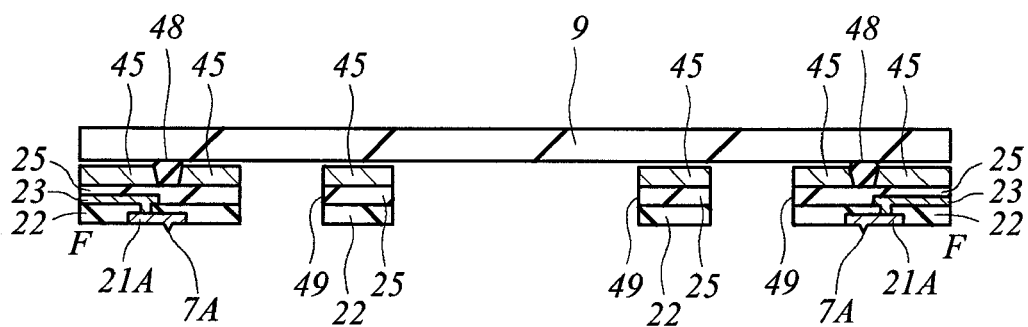
FIG. 39 is a principal part cross-sectional view which went along the F-F line in FIG. 38.
Figure 40:
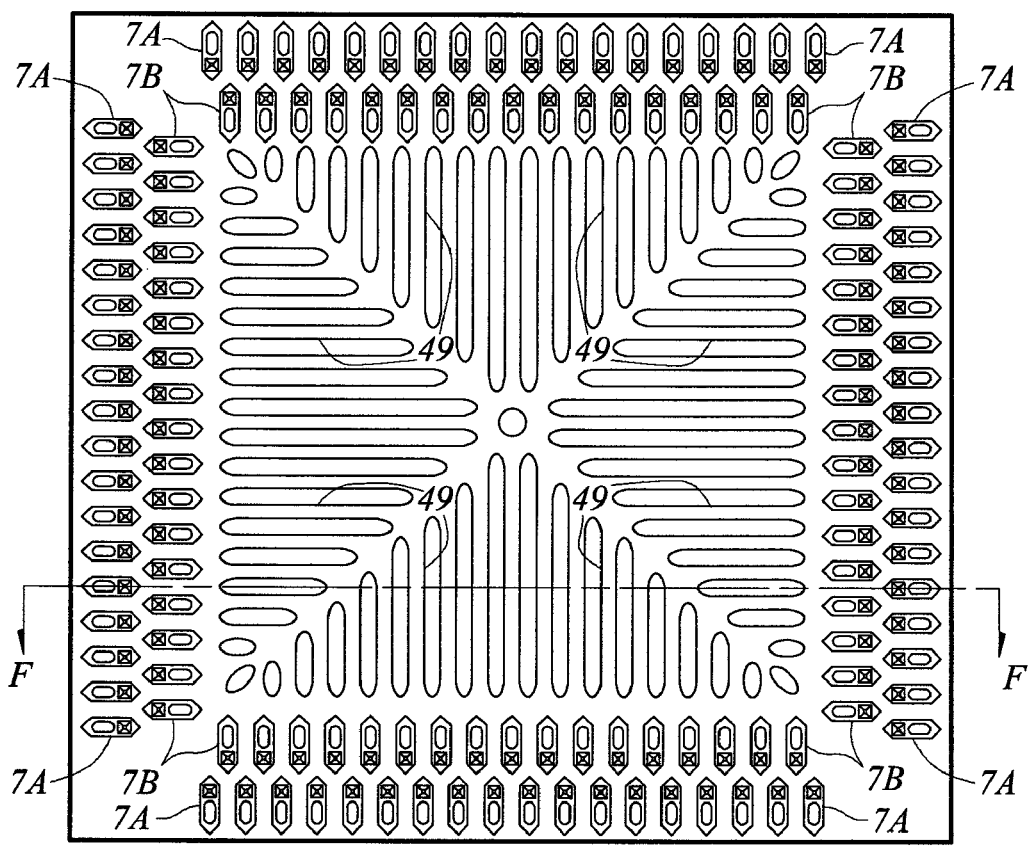
FIG. 40 is a principal part plan view of the thin films sheet which forms the probe card which is Embodiment 2 of the present invention.
Figure 41:
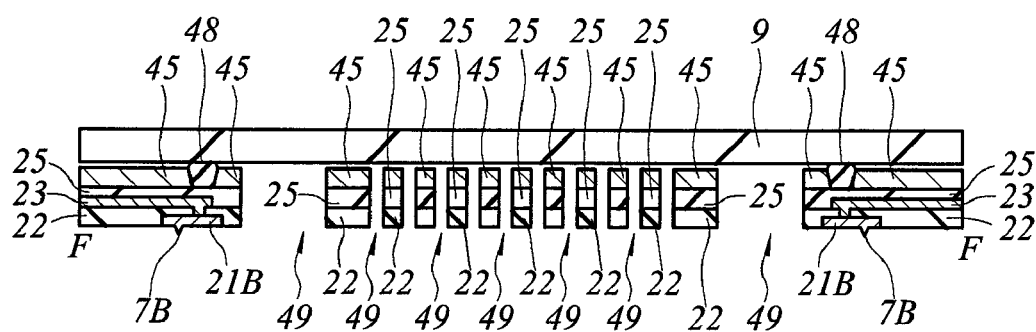
FIG. 41 is a principal part cross-sectional view which went along the F-F line in FIG. 40.
Figure 42:
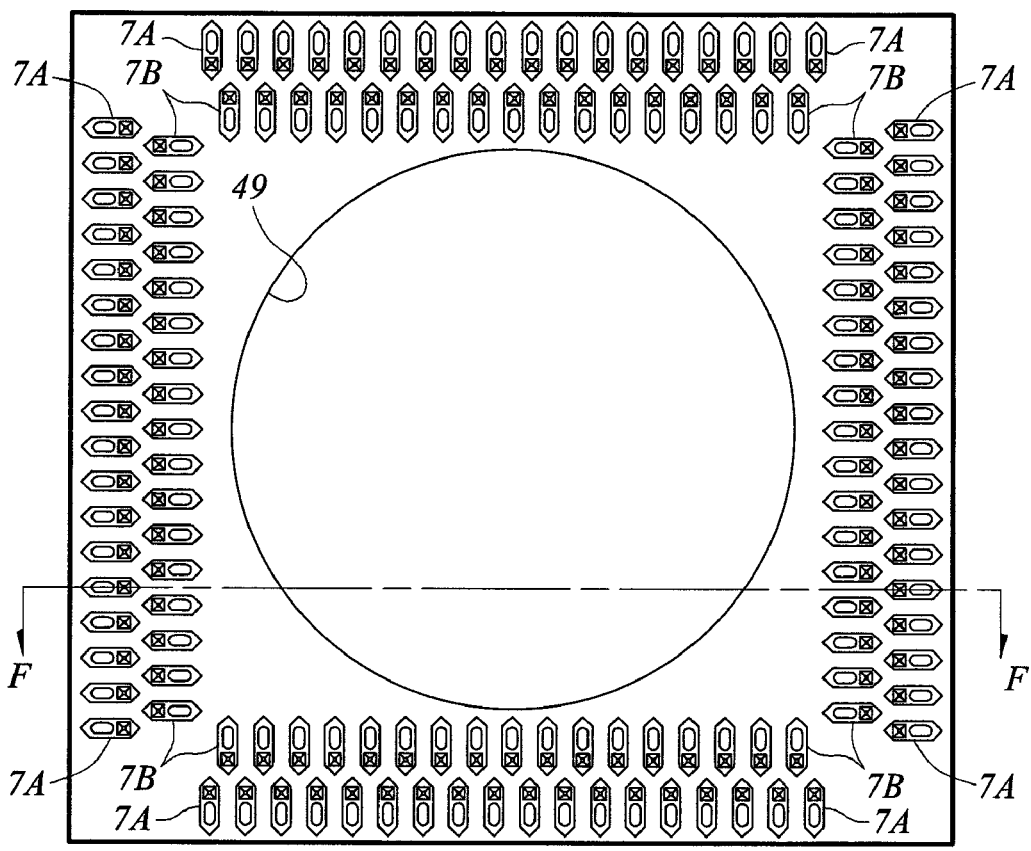
FIG. 42 is a principal part plan view of the thin films sheet which forms the probe card which is Embodiment 2 of the present invention.
Figure 43:
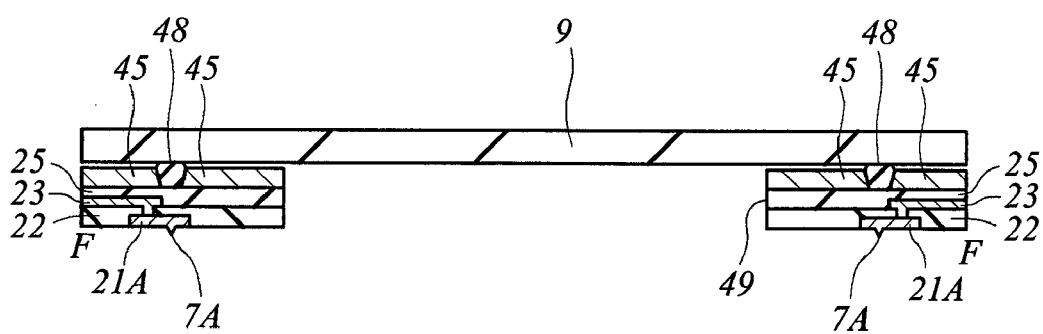
FIG. 43 is a principal part cross-sectional view which went along the F-F line in FIG. 42.
Figure 44:
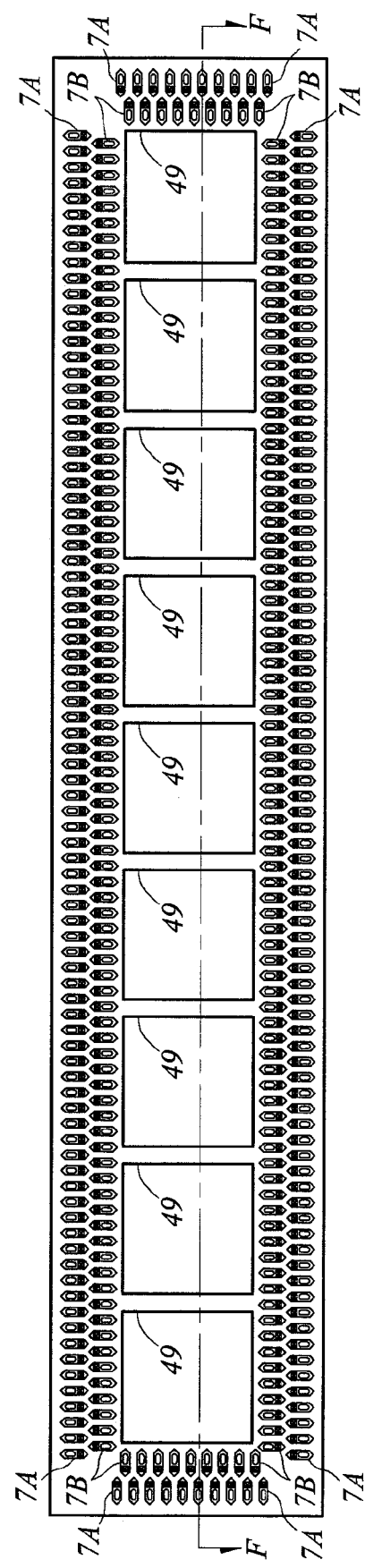
FIG. 44 is a principal part plan view of the thin films sheet which forms the probe card which is Embodiment 2 of the present invention.
Figure 45:
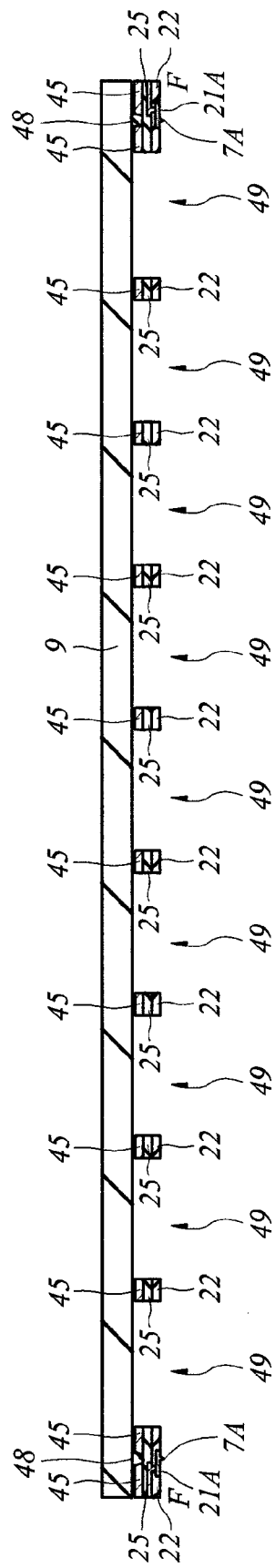
FIG. 45 is a principal part cross-sectional view which went along the F-F line in FIG. 44.

In Embodiment 2, the pattern of a rectangle as shown in FIG. 36 can be first exemplified as a plane pattern of opening 49. When the rigidity of thin films sheet 2 falls too much by setting it as the pattern of such a rectangle, as shown in FIG. 38, the structure which leaves polyimide films 22 and 25 and metal sheet 45 in the shape of a beam on the diagonal line of opening 49 of a plane rectangle is also good. This becomes possible to maintain desired rigidity at thin films sheet 2. As shown in FIG. 40, the structure of processing the pattern of opening 49 as shown in FIG. 38 in the shape of a slit, and leaving beam-like above-mentioned polyimide films 22 and 25 and above-mentioned metal sheet 45 is sufficient. It becomes possible to maintain desired rigidity at thin films sheet 2 also by it. Opening 49 of the shape of such a slit can shorten the time which processing takes by forming by opening processing using laser which was explained using FIG. 32. When adhesion ring 6 and pressing tool 9 which were explained using FIG. 6 and FIG. 7 are plane circular shape, as shown in FIG. 42, it is good also considering opening 49 as a pattern of plane circular shape. When adhesion ring 6 and pressing tool 9 are plane circular shape and opening 49 is a pattern of plane rectangular shape, we will be anxious about the unnecessary force concentrating on the corner part of a rectangle pattern etc. However, it becomes possible by setting it as the pattern of plane circular shape to prevent concentration of such unnecessary force. As explained using FIG. 3, chip CHP to be examined is a rectangle which has a short side and a long side at a plane. From this, as shown in FIG. 44, opening 49 is formed by the pattern of the plane rectangle which has a short side and a long side. And it is good also as a structure of leaving polyimide films 22 and 25 and metal sheet 45 in the shape of a plurality of beams extending and existing in the direction which went along the short side in the pattern. Thereby, it becomes possible to maintain desired rigidity at thin films sheet 2.

Also by the above Embodiment 2, the same effect as the Embodiment 1 can be acquired.

Embodiment 3

Figure 46:
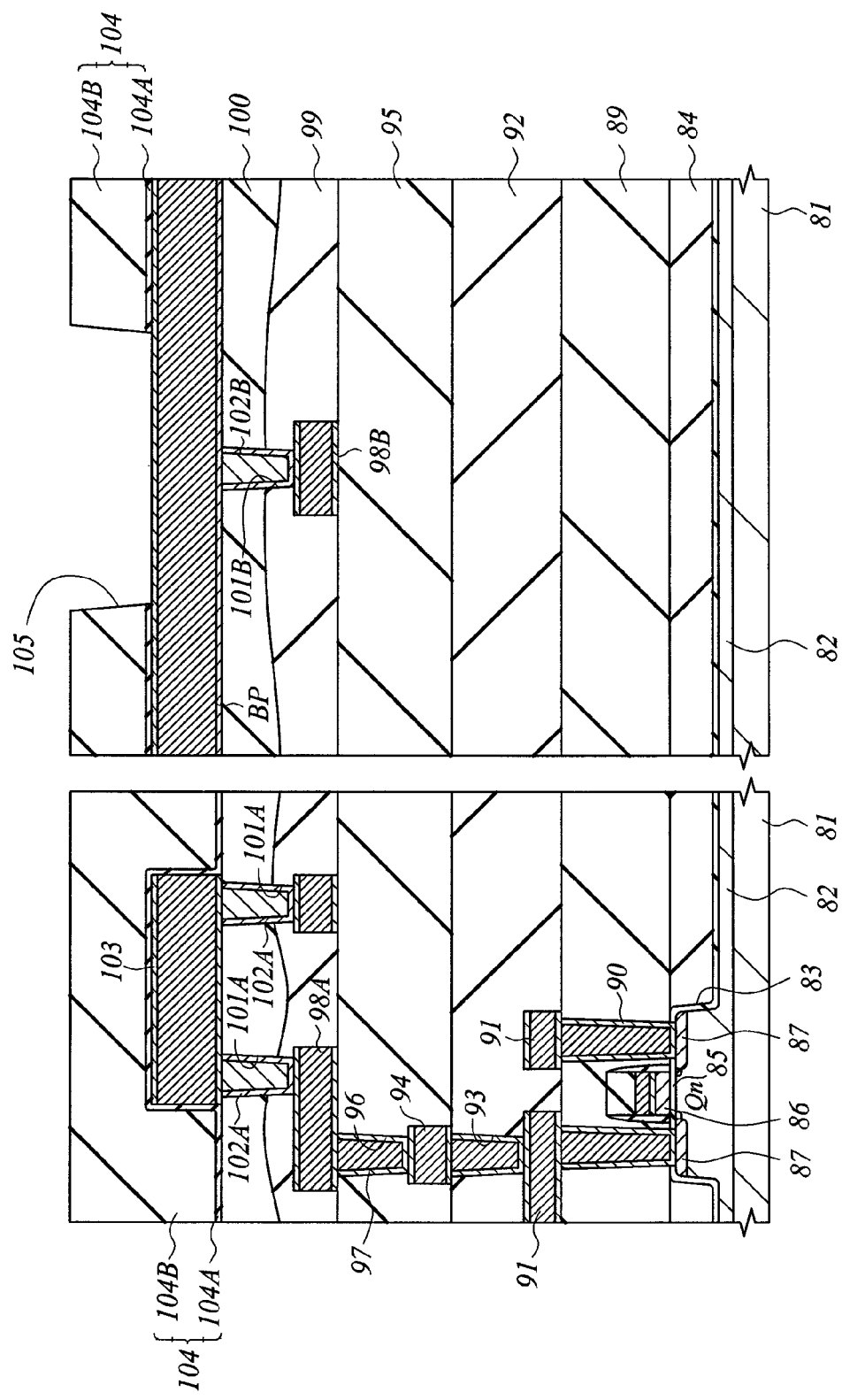
FIG. 46 is a principal part cross-sectional view in the manufacturing process of the semiconductor integrated circuit device which is Embodiment 3 of the present invention.

FIG. 46 is a cross-sectional view showing the principal part of the chip in which the semiconductor integrated circuit device of Embodiment 3 was formed. The section on the left-hand side of space shows the region in which the lamination wiring was formed, and the section on the right-hand side of space shows the region in which the bonding pad (it is only henceforth described as a pad) was formed.

For example, p type well 82 is formed in the main surface of substrate 81 which consists of p type single-crystal Si (silicon), and element isolation trench 83 is formed in the element isolation region of a p type well. Element isolation trench 83 has structure which embedded insulating films 84, such as silicon oxide, in the trench which is formed by etching substrate 81.

N channel type MISFET Qn mainly consists of gate oxide film 85, gate electrode 86, and n-type semiconductor region (a source, a drain) 87 of LDD (Lightly Doped Drain) structure. Gate electrode 86 is formed with for example, the conductive film of three layers which laminated the low resistance polycrystalline silicon film with which P (phosphorus) was doped, WN (tungsten nitride) film, and W (tungsten) film.

Silicon oxide film 89 is formed in the upper part of n channel type MISFET. The contact hole which reaches n-type semiconductor region (a source, a drain) 87 of n channel type MISFET Qn is formed in this silicon oxide film 89. In the inside of the contact hole, plug 90 which consists of a laminated film of a barrier metal (TiN/Ti) and W film, for example is embedded.

Wiring 91 of the 1st layer is formed on silicon oxide film 89. This wiring 91 is formed, for example with the conductive film of three layers which consists of an aluminum alloy film (for example, Cu (copper) and Si are included) of the thick thickness which includes Al as a principal component, and Ti film and the TiN film of thin thickness which sandwiches this aluminum alloy film. Wiring 91 is electrically connected with one side of n-type semiconductor region (a source, a drain) 87 of n channel type MISFET Qn through the above-mentioned plug 90.

Silicon oxide film 92 is formed in the upper part of wiring 91. The contact hole which reaches wiring 91 is formed in this silicon oxide film 92. In the inside of the contact hole, plug 93 which consists of a laminated film of a barrier metal (TiN/Ti) and W film as well as the above-mentioned plug 90 is embedded.

On silicon oxide film 92, wiring 94 of the 2nd layer of the same structure as wiring 91 is formed. This wiring 94 is electrically connected with wiring 91 through the above-mentioned plug 93.

Silicon oxide film 95 is formed on wiring 94. Contact hole 96 which reaches wiring 94 is formed in this silicon oxide film 95. In the inside, plug 97 which consists of a laminated film of a barrier metal (TiN/Ti) and W film as well as the above-mentioned plugs 90 and 93 is embedded.

On silicon oxide film 95, wirings 98A and 98B of the 3rd layer of the same structure as wiring 91 and 94 are formed. Wiring 98A arranged to the region in which the lamination wiring was formed is electrically connected with wiring 94 through plug 97. Wiring 98B is arranged to the region in which the pad was formed.

On wiring 98, silicon oxide films 99 and 100 formed in plasma are laminated. In the region in which the lamination wiring was formed, contact hole 101A which reaches wiring 98A is formed in silicon oxide films 99 and 100. In the inside, plug 102A which consists of a laminated film of the barrier metal (TiN/Ti) of thin thickness and W film of thick thickness as well as the above-mentioned plugs 90, 93, and 97 is embedded. On the other hand, in the region in which the pad was formed, contact hole 101B which reaches wiring 98B is formed in silicon oxide films 99 and 100. In the inside, plug 102B which consists of a laminated film of a barrier metal (TiN/Ti) and W film is embedded.

In the region in which the lamination wiring was formed, wiring 103 of the 4th layer is formed on silicon oxide film 100. Pad (pad electrode) BP is formed in the upper part of plug 102B.

The above-mentioned wiring 103 is formed from the conductive film of three layers which consists of an aluminum alloy film of thick thickness, and Ti film and the TiN film of thin thickness which sandwiches this aluminum alloy film. This wiring 103 is electrically connected with wiring 98A through the above-mentioned plug 102A. Pad BP is formed using the wiring formed at the same step as the wiring 103 formed with the conductive film of three layers.

Passivation film 104 formed by the insulating film of two layers which laminated silicon oxide film 104A and silicon nitride film 104B, for example is formed in the upper part of wiring 103 of the 4th layer, and pad BP. Opening 105 which reaches pad BP is formed in this passivation film 104 in the upper part of pad BP.

The chip of Embodiment 3 is mounted using a bonding wire (illustration is omitted). A probe test can be carried out using the probe card explained by the Embodiments 1 and 2 also to such a chip. It is pad BP which probe 7 (refer to FIG. 7) explained by the Embodiments 1 and 2 contacts in the case. After a probe test is completed, substrate 81 is divided to each chip and a chip is mounted to a mounting substrate by connecting a bonding wire to pad BP and a mounting substrate (illustration being omitted).

Also by the above Embodiment 3, the same effect as the Embodiments 1 and 2 can be acquired.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, the embodiment explained the case where it contacted the probe formed in the thin films sheet to a bump electrode, and a probe test was carried out. However, before forming a bump electrode, a probe may be contacted to the pad arranged under a bump electrode, and a probe test may be carried out.

INDUSTRIAL APPLICABILITY

The manufacturing method of the semiconductor integrated circuit device of the present invention is widely applicable to the probe test step in the manufacturing process of a semiconductor integrated circuit device, for example.

The invention claimed is:

1. A method of manufacturing a semiconductor integrated circuit device, comprising the steps of;
   (a) preparing a semiconductor wafer which is demarcated in a plurality of chip areas, in which a semiconductor integrated circuit is formed in each of the chip areas, and over which a plurality of first electrodes electrically connected with the semiconductor integrated circuit are formed over a main surface;
   (b) preparing a first card including a first wiring substrate in which a first wiring is formed, a first sheet which is held at the first wiring substrate, in which a plurality of contact terminals for making contact with the first electrodes and a second wiring which electrically connects with the contact terminals are formed, and with which the second wiring electrically connects with the first wiring, and a tip of the contact terminals faces a main surface of the semiconductor wafer, an adhesion ring which spaces out and holds a first region in which the contact terminals are formed in the first sheet from the first wiring substrate, an extrusion mechanism which extrudes the first region in the first sheet from a back surface side, a plunger mechanism which travels to and pushes with a thrust on the extrusion mechanism so as to extend the first sheet, and a pressurizing mechanism which controls an amount of contact pressurization of the contact terminals on the first electrodes by acting on the extrusion mechanism at a time of contacting the tip of the contact terminals to the first electrodes
   wherein a lower surface of the adhesion ring contacts the first sheet,
   wherein the extrusion mechanism, the adhesion ring, and the plunger mechanism constitute one mechanism by fixation, wherein the pressurizing mechanism is disposed over the adhesion ring such that the thrust transmitted to the first sheet is controlled by a strength of the pressurizing mechanism; and
   (c) conducting an electric test of the semiconductor integrated circuit by contacting the tip of the contact terminals to the first electrodes;
   wherein an extrusion amount of the first region by the extrusion mechanism and the amount of contact pressurization by the pressurizing mechanism are controlled independently, respectively.

2. A method of manufacturing a semiconductor integrated circuit device according to claim 1, wherein a tip of the contact terminal is extruded from the adhesion ring.

3. A method of manufacturing a semiconductor integrated circuit device according to claim 1, wherein in the step (c), a load applied to the one contact terminal is less than 3 g.

4. A method of manufacturing a semiconductor integrated circuit device according to claim 1, wherein an insulating film with a low dielectric constant compared with $SiO_2$ is formed over the main surface of the semiconductor wafer.

5. A method of manufacturing a semiconductor integrated circuit device according to claim 1, wherein the semiconductor integrated circuit is arranged under the first electrode.

6. A method of manufacturing a semiconductor integrated circuit device according to claim 1, wherein the first electrode is a projection electrode including gold as a principal component, or a pad electrode including aluminum as a principal component.

7. A method of manufacturing a semiconductor integrated circuit device, comprising the steps of;
   (a) preparing a semiconductor wafer which is demarcated in a plurality of chip areas, in which a semiconductor integrated circuit is formed in each of the chip areas, and over which a plurality of first electrodes electrically connected with the semiconductor integrated circuit are formed over a main surface;
   (b) preparing a first card including a first wiring substrate in which a first wiring is formed, a first sheet which is held at the first wiring substrate, in which a plurality of contact terminals for making contact with the first electrodes and a second wiring which electrically connects with the contact terminals are formed, and with which the second wiring electrically connects with the first wiring, and a tip of the contact terminals faces a main surface of the semiconductor wafer, an adhesion ring which spaces out and holds a first region in which the contact terminals are formed in the first sheet from the first wiring substrate, an extrusion mechanism which extrudes the first region in the first sheet from a back surface side, a plunger mechanism which travels to and pushes with a thrust to the extrusion mechanism so as to extend the first sheet, and a pressurizing mechanism which controls an amount of contact pressurization of the contact terminals on the first electrodes by acting on the extrusion mechanism at a time of contacting the tip of the contact terminals to the first electrodes, the spring mechanism and the pressurizing mechanism being controlled independently of one another,
   wherein a lower surface of the adhesion ring contacts the first sheet,
   wherein the extrusion mechanism, the adhesion ring, and the plunger mechanism constitute one mechanism by fixation, wherein the pressurizing mechanism is disposed over the adhesion ring such that the thrust transmitted to the first sheet is controlled by a strength of the pressurizing mechanism; and
   (c) conducting an electric test of the semiconductor integrated circuit by contacting the tip of the contact terminals to the first electrodes;
   wherein
   the extrusion mechanism is stuck over the back surface side of the first region of the first sheet; and
   an extrusion amount of the first region by the extrusion mechanism and the amount of contact pressurization by the pressurizing mechanism are controlled independently, respectively.

8. A method of manufacturing a semiconductor integrated circuit device according to claim 7, wherein a tip of the contact terminal is extruded from the adhesion ring.

9. A method of manufacturing a semiconductor integrated circuit device according to claim 7, wherein in the step (c), load applied to the one contact terminal is less than 3 g.

10. A method of manufacturing a semiconductor integrated circuit device according to claim 7, wherein an insulating film with a low dielectric constant compared with $SiO_2$ is formed over the main surface of the semiconductor wafer.

11. A method of manufacturing a semiconductor integrated circuit device according to claim 8, wherein the semiconductor integrated circuit is arranged under the first electrode.

12. A method of manufacturing a semiconductor integrated circuit device according to claim 9, wherein the first electrode is a projection electrode including gold as a principal component, or a pad electrode including aluminum as a principal component.

13. A method of manufacturing a semiconductor integrated circuit device according to claim 1, wherein the pressurizing mechanism acts such that the extrusion mechanism extrudes the first region in the first sheet from the back surface side at the contacting time.

14. A method of manufacturing a semiconductor integrated circuit device according to claim 13, wherein, at the contacting time, a thrust transmitted from the spring mechanism to the first sheet is used for an extension of the first sheet.

15. A method of manufacturing a semiconductor integrated circuit device according to claim 13, wherein, at the contacting time, a thrust transmitted from the spring mechanism to the first sheet is used only for an extension of the first sheet.

16. A method of manufacturing a semiconductor integrated circuit device according to claim 7, wherein the pressurizing mechanism acts such that the extrusion mechanism extrudes the first region in the first sheet from the back surface side at the contacting time.

17. A method of manufacturing a semiconductor integrated circuit device according to claim 16, wherein, at the contacting time, a thrust transmitted from the spring mechanism to the first sheet is used for an extension of the first sheet.

18. A method of manufacturing a semiconductor integrated circuit device according to claim 16, wherein, at the contacting time, a thrust transmitted from the spring mechanism to the first sheet is used only for an extension of the first sheet.

19. The method according to claim 1, wherein the plunger mechanism includes a plunger and a spring mechanism built in the plunger.

20. The method according to claim 7, wherein the plunger mechanism includes a plunger and a spring mechanism built in the plunger.

21. The method according to claim 1, wherein the pressurizing mechanism includes a spring mechanism.

22. The method according to claim 7, wherein the pressurizing mechanism includes a spring mechanism.

23. The method according to claim 1, wherein the plunger mechanism serves to make the first sheet extend out from an under surface of the first wiring substrate.

24. The method according to claim 7, wherein the plunger mechanism serves to make the first sheet extend out from an under surface of the first wiring substrate.

* * * * *